(12) United States Patent
Nirengi et al.

(10) Patent No.: US 9,692,019 B2
(45) Date of Patent: Jun. 27, 2017

(54) ELEMENT MANUFACTURING METHOD AND ELEMENT MANUFACTURING APPARATUS UTILIZING DIFFERENTIAL PRESSURE FOR COVERING A SUBSTRATE

(71) Applicant: DAI NIPPON PRINTING CO., LTD., Tokyo (JP)

(72) Inventors: Takayoshi Nirengi, Tokyo (JP); Toshihiko Takeda, Tokyo (JP); Hiroyoshi Nakajima, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 14/777,794

(22) PCT Filed: Mar. 28, 2014

(86) PCT No.: PCT/JP2014/059265
§ 371 (c)(1),
(2) Date: Sep. 17, 2015

(87) PCT Pub. No.: WO2014/157658
PCT Pub. Date: Oct. 2, 2014

(65) Prior Publication Data
US 2016/0197312 A1    Jul. 7, 2016

(30) Foreign Application Priority Data

Mar. 29, 2013 (JP) ................................. 2013-072013
Nov. 15, 2013 (JP) ................................. 2013-237397

(51) Int. Cl.
*H01L 21/00* (2006.01)
*H01L 51/56* (2006.01)
(Continued)

(52) U.S. Cl.
CPC ............ *H01L 51/56* (2013.01); *H01L 51/003* (2013.01); *H01L 51/0013* (2013.01);
(Continued)

(58) Field of Classification Search
CPC .......... H01L 51/56; H01L 51/00; H01L 51/52; H01J 9/02
(Continued)

(56) References Cited

U.S. PATENT DOCUMENTS

| 5,998,085 A * | 12/1999 | Isberg | .................... B41M 5/265 156/234 |
| 6,114,088 A * | 9/2000 | Wolk | .................... B41M 3/006 346/135.1 |

(Continued)

FOREIGN PATENT DOCUMENTS

| JP | 11-185956 A1 | 7/1999 |
| JP | 2006-179465 A1 | 7/2006 |

(Continued)

OTHER PUBLICATIONS

International Search Report (Application No. PCT/JP2014/059265) dated Jul. 1, 2014.
(Continued)

*Primary Examiner* — Caleb Henry
(74) *Attorney, Agent, or Firm* — Burr & Brown, PLLC

(57) ABSTRACT

To provide an element manufacturing method and element manufacturing apparatus for efficiently manufacturing an element such as an organic semiconductor element. First, an intermediate product, which includes a substrate and a protrusion extending in a normal direction of the substrate, is formed. Next, the intermediate product is covered, at a side where the protrusion is provided, with a first surface of a lid member. After the covering of the intermediate product, a gas is injected into an enclosed space formed at a side of
(Continued)

a second surface of the lid member that is present on an opposite side of the first surface. This enhances an internal pressure of the enclosed space, thus bringing the first surface of the lid member into close contact with the intermediate product.

30 Claims, 14 Drawing Sheets

(51) Int. Cl.
    *H01L 51/00* (2006.01)
    *H01L 51/52* (2006.01)
(52) U.S. Cl.
    CPC ........ *H01L 51/524* (2013.01); *H01L 51/5212* (2013.01); *H01L 51/5228* (2013.01); *Y02E 10/549* (2013.01); *Y02P 70/521* (2015.11)
(58) Field of Classification Search
    USPC ............................... 438/28; 445/24; 29/25.01
    See application file for complete search history.

(56) References Cited

U.S. PATENT DOCUMENTS

| | | | | |
|---|---|---|---|---|
| 7,534,544 | B2* | 5/2009 | Principe | B41M 5/38207 430/200 |
| 8,388,399 | B2* | 3/2013 | Kim | H01L 51/0024 313/483 |
| 8,482,422 | B2* | 7/2013 | Ji | C23C 14/042 118/500 |
| 8,809,879 | B2* | 8/2014 | Yoshizumi | H01L 51/0014 257/88 |
| 8,969,106 | B2* | 3/2015 | Lee | B23K 26/127 257/40 |
| 2006/0044387 | A1* | 3/2006 | Kim | B41J 2/325 347/262 |
| 2006/0081332 | A1* | 4/2006 | Kang | B32B 37/10 156/285 |
| 2006/0082640 | A1* | 4/2006 | Chin | B41J 3/407 347/238 |
| 2006/0087550 | A1* | 4/2006 | Kang | B23K 26/0648 347/224 |
| 2006/0132589 | A1* | 6/2006 | Kang | H01L 51/0013 347/225 |
| 2006/0227281 | A1* | 10/2006 | Kang | H01L 51/0013 349/158 |
| 2007/0045540 | A1* | 3/2007 | Kang | B41M 5/265 250/330 |
| 2007/0048436 | A1* | 3/2007 | Kang | G03F 1/00 427/64 |
| 2007/0048657 | A1* | 3/2007 | Noh | B41M 5/38285 430/199 |
| 2007/0048893 | A1* | 3/2007 | Noh | H01L 51/0013 438/82 |
| 2007/0103540 | A1* | 5/2007 | Noh | B41J 2/471 347/238 |
| 2007/0103920 | A1* | 5/2007 | Noh | B41J 2/325 362/458 |
| 2007/0109391 | A1* | 5/2007 | Noh | B41J 2/447 347/172 |
| 2007/0111117 | A1* | 5/2007 | Noh | B41M 5/38207 430/41 |
| 2007/0178402 | A1* | 8/2007 | Lee | H01L 51/0013 430/199 |
| 2008/0287028 | A1* | 11/2008 | Ozawa | H01L 51/56 445/24 |
| 2008/0305287 | A1* | 12/2008 | Ohata | H01L 51/0013 428/32.39 |
| 2009/0105071 | A1* | 4/2009 | Principe | G02B 5/201 503/227 |
| 2011/0180203 | A1* | 7/2011 | Sun | B41M 5/38221 156/247 |
| 2012/0099615 | A1* | 4/2012 | Sun | H01L 51/0013 372/103 |
| 2012/0318447 | A1 | 12/2012 | Ozawa | |
| 2013/0002793 | A1* | 1/2013 | Kim | H01L 51/0013 347/256 |
| 2016/0172589 | A1* | 6/2016 | Nirengi | H01L 51/5228 438/99 |
| 2016/0190453 | A1* | 6/2016 | Nirengi | H01L 51/5246 438/99 |

FOREIGN PATENT DOCUMENTS

| | | |
|---|---|---|
| JP | 2009-087996 A1 | 4/2009 |
| JP | 4340982 B2 | 10/2009 |
| JP | 2011-009498 A1 | 1/2011 |
| JP | 2011-151195 A1 | 8/2011 |
| TW | 201230431 A1 | 7/2012 |

OTHER PUBLICATIONS

English Translation of International Preliminary Report on Patentability, International Application No. PCT/JP2014/059265, dated Sep. 29, 2015 (7 pages).
Taiwanese Office Action (Application No. 103111726) dated Dec. 13, 2016 (with English translation).

* cited by examiner

ELEMENT MANUFACTURING METHOD AND ELEMENT MANUFACTURING APPARATUS UTILIZING DIFFERENTIAL PRESSURE FOR COVERING A SUBSTRATE

BACKGROUND OF THE INVENTION

Field of the Invention

The present invention relates to an element manufacturing method and element manufacturing apparatus for manufacturing elements such as organic semiconductor elements.

Background Art

Processes in manufacturing such elements as organic semiconductor elements and inorganic semiconductor elements are performed generally under a vacuum environment to prevent impurities from entering the elements. For example, thin film deposition techniques under the vacuum environment, such as sputtering, vapor deposition, or other techniques are used as a method for forming cathodic electrodes, anodic electrodes, and semiconductor layers on a substrate. The vacuum environment is provided by using a vacuum pump or other means to evacuate the inside of an element manufacturing apparatus for a predetermined time.

In the manufacturing processes for the above elements, various steps are executed in addition to a film deposition step. These steps include ones that are traditionally executed under atmospheric pressure. In contrast, as discussed above a predetermined time period is spent to provide the vacuum environment. Accordingly, when in addition to the film deposition step executed under the vacuum environment the steps executed under atmospheric pressure are further included in the manufacturing processes for such an element, a great deal of time is needed for evacuating the inside of the element manufacturing apparatus or replacing an internal environment of the element manufacturing apparatus with atmospheric air. In light of this factor, it is desirable that the element manufacturing steps be executed under an environment whose pressure is lower than atmospheric pressure. This enables reduction in the time and costs needed to obtain one element.

Steps other than film deposition include the step of removing an organic semiconductor layer positioned on an auxiliary electrode. Patent Document 1, for example, describes such a step. When another electrode disposed on the organic semiconductor layer is a common electrode of a thin-film form, the auxiliary electrode is disposed to suppress a location-by-location difference in magnitude of a voltage drop developed across the common electrode. That is to say, connecting the common electrode to the auxiliary electrode at various locations allows the voltage drop across the common electrode to be reduced. Meanwhile, since the organic semiconductor layer is generally provided over an entire region of the substrate, the above-discussed removing step for removing the organic semiconductor layer on the auxiliary electrode needs to be executed to connect the common electrode to the auxiliary electrode.

A known method for removing the organic semiconductor layer present on an auxiliary electrode is by irradiating the organic semiconductor layer with light such as laser light. In this case, the organic semiconductor material constituting the organic semiconductor layer will be dispersed during the removal of the organic semiconductor layer by ablation. To prevent contamination with the organic semiconductor material that has been dispersed, therefore, it is preferable that the substrate be covered with some kind of material. Patent Document 1, for example, proposes a method in which first a counter substrate is overlaid upon the substrate under a vacuum environment to constitute an overlay substrate, next while a space between the counter substrate and the substrate is being maintained under the vacuum atmosphere, the overlay substrate is taken out from the vacuum environment into the atmospheric air, and after this operation, the organic semiconductor layer is irradiated with laser light. On the basis of a differential pressure between the vacuum atmosphere and the atmospheric air, this method enables the counter substrate to be brought into strong and close contact with the substrate, thereby enabling reliable prevention of contamination with the organic semiconductor material that has been dispersed.

PRIOR ART DOCUMENTS

Patent Documents

Patent Document 1: JP No. 4340982

SUMMARY OF THE INVENTION

Problems to be Solved by the Invention

When part of the element manufacturing steps is executed in the atmospheric air as described in Patent Document 1, a great deal of time is needed to evacuate the inside of the element manufacturing apparatus or to replace the internal environment of the element manufacturing apparatus with atmospheric air. For minimum time consumption, it is desirable that the step of covering the substrate by utilizing the differential pressure be executed under a vacuum environment inside the element manufacturing apparatus. The method for covering the substrate under a vacuum environment by utilizing the differential pressure, however, has traditionally not been proposed.

The present invention has been made with the above in mind, and an object of the invention is to provide an element manufacturing method and element manufacturing apparatus designed to efficiently manufacture an element such as an organic semiconductor element by covering a substrate under a vacuum environment by use of a differential pressure.

Means for Solving the Problem

The present invention includes an element manufacturing method for forming an element on a substrate. The method including: the step of providing an intermediate product that includes the substrate and a protrusion extending in a normal direction of the substrate; the step of covering the intermediate product, at a side where the protrusion is provided, with a first surface of a lid member; and a close-fitting step of bringing the first surface of the lid member into close contact with the intermediate product in such a manner that a gas is injected into an enclosed space hermetically sealed from surroundings and formed on the lid member at a second surface opposite to the first surface so that an internal pressure of the enclosed space becomes higher than an internal pressure of a space between the lid member and the intermediate product.

The element manufacturing method according to the present invention may further include the step of, prior to the close-fitting step, forming the enclosed space hermetically sealed from surroundings, in a space contiguous to the second surface of the lid member. In this case, the enclosed space may be formed in a space bounded by the second surface of the lid member and a first sealing jig placed at a side of the second surface of the lid member. More specifically, the enclosed space is formed by moving the lid member toward the first sealing jig so that the lid member and the first sealing jig come into contact with each other.

In the element manufacturing method according to the present invention, the enclosed space may be formed in a space bounded by a film disposed so as to face the second surface of the lid member, and a first sealing jig to which the film is fixed. In this case, the enclosed space may be formed at an opposite side of the film relative to a side thereof that faces the lid member, and in the close-fitting step, the first surface of the lid member may be brought into close contact with the intermediate product in such a manner that a gas is injected into the enclosed space so that an internal pressure of the enclosed space becomes higher than an internal pressure of a space present between the lid member and the intermediate product, resulting expansion of the enclosed space displaces the film toward the lid member, and thus the film presses the lid member.

The element manufacturing method according to the present invention may further include a light irradiation step executed so that while the first surface of the lid member is in close contact with the intermediate product in the close-fitting step, a light irradiator disposed externally to the first sealing jig irradiates the intermediate product with light through the first sealing jig and the lid member. The first sealing jig may include a light-transmitting region formed from a material having a light-transmitting property. In this case, in the close-fitting step an outer enclosed space blocked from atmospheric air may be formed in an external space of the first sealing jig that is contiguous to the light-transmitting region of the first sealing jig, the light irradiator may be disposed externally to the outer enclosed space, and the external space of the first sealing jig that is contiguous to the light-transmitting region of the first sealing jig may communicate with a space surrounding the light irradiator.

The element manufacturing method according to the present invention may be executed under a vacuum environment.

In the element manufacturing method according to of the present invention, the element may include the substrate, a plurality of first electrodes each disposed on the substrate, an auxiliary electrode and the protrusion both disposed between the first electrodes, an organic semiconductor layer disposed on the first electrode, and a second electrode disposed on the organic semiconductor layer and the auxiliary electrode. The intermediate product may include the substrate, the plurality of first electrodes disposed on the substrate, the auxiliary electrode and protrusion disposed between the first electrodes, and the organic semiconductor layer disposed on the first electrode and the auxiliary electrode. In this case, the element manufacturing method according to the invention may further include the step of, after the close-fitting step, removing the organic semiconductor layer disposed on the auxiliary electrode.

In the element manufacturing method according to the present invention, the auxiliary electrode may be partly covered with the protrusion and the removing step may include the step of irradiating with light the organic semiconductor layer on the auxiliary electrode disposed adjacently to the protrusion.

In the element manufacturing method according to the present invention, the protrusion may be at least partly covered with the auxiliary electrode, and the organic semiconductor layer on the auxiliary electrode positioned on the protrusion may be removed in the removing step.

In the element manufacturing method according to the present invention, the intermediate product may include the substrate, the protrusion disposed on the substrate, and a layer to be exposed to light. The element manufacturing method may further include the step of, after the close-fitting step, emitting exposure light toward the layer to be exposed to light.

In the element manufacturing method according to the present invention, a vapor deposition material may be disposed on the first surface of the lid member. The element manufacturing method may further include the step of, after the close-fitting step, vapor-depositing the vapor deposition material on the substrate by irradiating the vapor deposition material with light.

In the element manufacturing method according to the present invention, the lid member may be supplied by a roll-to-roll process.

In the element manufacturing method according to the present invention, the enclosed space may be formed so that it encompasses the intermediate product as viewed along the normal direction of the substrate in the intermediate product.

In the element manufacturing method according to the present invention, a first sealing jig that includes a principal plane and a side surface extending from the principal plane, toward the lid member, may be disposed at the side of the second surface of the lid member. In this case, in the close-fitting step the enclosed space as viewed from the normal direction of the substrate in the intermediate product has a profile defined by the side surface of the first sealing jig. In addition, the element manufacturing method further includes a light irradiation step executed so that while the first surface of the lid member is in close contact with the intermediate product in the close-fitting step, a light irradiator disposed externally to the first sealing jig irradiates the intermediate product with light through the principal surface of the first sealing jig and the lid member.

In the element manufacturing method according to the present invention, the principal plane of the first sealing jig may include a section that allows light from the light irradiator to pass through, and this section serves as a light-transmitting region constructed of a material having a light-transmitting property. In this case, in the close-fitting step, an outer enclosed space blocked from atmospheric air is formed in an external space of the first sealing jig that is contiguous to the light-transmitting region of the first sealing jig, and the light irradiator is disposed externally to the outer enclosed space. On the other hand, in the light irradiation step, the external space of the first sealing jig that is contiguous to the light-transmitting region of the first sealing jig communicates with a space surrounding the light irradiator.

In the element manufacturing method according to the present invention, the principal plane of the first sealing jig that includes the section allowing the light from the light irradiator to pass through may be formed by an open-and-close controllable window, and the light irradiator may be placed inside an auxiliary chamber configured to communicate with an internal space of the first sealing jig when the open-and-close controllable window of the first sealing jig is open. In this case, the first sealing jig is contiguous to the second surface of the lid member under an environment controlled to a first pressure and under a closed state of the open-and-close controllable window of the first sealing jig, and thereby forms the enclosed space at the side of the second surface of the lid member. Meanwhile, in the light irradiation step, the open-and-close controllable window of the first sealing jig is open and a pressure in the internal space of the first sealing jig and a pressure in an internal space of the auxiliary chamber are controlled to a second pressure higher than the first pressure.

The present invention includes an element manufacturing apparatus for forming an element on a substrate. The apparatus includes a sealing mechanism configured to bring a lid member into close contact with an intermediate product that includes the substrate and a protrusion extending in a normal direction of the substrate, the lid member being brought into close contact at a side where the protrusion is provided. The sealing mechanism includes a lid member supply part to supply the lid member and a pressure application part. The pressure application part injects a gas into an enclosed space hermetically sealed from surroundings and formed on a second surface of the lid member that is present on an opposite side thereof with respect to the first surface. This makes an internal pressure of the enclosed space to a pressure higher than an internal pressure of a space between the lid member and the intermediate product. Accordingly, the first surface of the lid member is brought into close contact with the intermediate product.

In the element manufacturing apparatus according to the present invention, the enclosed space may be formed by the second surface of the lid member and a first sealing jig placed at a side of the second surface of the lid member. In this case, the enclosed space may be formed by moving the lid member into relative close proximity to the first sealing jig so that the lid member and the first sealing jig come into contact with each other.

In the element manufacturing apparatus according to the present invention, the enclosed space may be formed in a space bounded by a film disposed so as to face the second surface of the lid member, and a first sealing jig to which the film is fixed. In this case, the enclosed space may be formed at an opposite side of the film relative to a side thereof that faces the lid member, and the pressure application part may be configured to bring the first surface of the lid member into close contact with the intermediate product by injecting a gas into the enclosed space so that the enclosed space raises an internal pressure to a pressure higher than an internal pressure of a space present between the lid member and the intermediate product, and so that resulting expansion of the enclosed space displaces the film toward the lid member, hence pressing the film against the lid member.

The element manufacturing apparatus according to the present invention may further include a light irradiator disposed externally to the first sealing jig. The light irradiator may emit light toward the intermediate product through the first sealing jig and the lid member while the first surface of the lid member is in close contact with the intermediate product. The first sealing jig may include a light-transmitting region formed from a material having a light-transmitting property. In this case, the sealing mechanism may further include a third sealing jig disposed adjacently to the light-transmitting region of the first sealing jig, the third sealing jig including an open-and-close controllable window; when the pressure in the internal space of the first sealing jig is lower than the second pressure, an outer enclosed space blocked from atmospheric air and contiguous to the light-transmitting region of the first sealing jig may be formed in an internal space of the third sealing jig and the light irradiator may be disposed externally to the outer enclosed space; and when the light irradiator emits light toward the intermediate product, the open-and-close controllable window of the third sealing jig may be opened.

The element manufacturing apparatus according to the present invention may be one that forms an element on a substrate under a vacuum environment.

In the element manufacturing apparatus according to the present invention, the pressure application part may include a substrate including a light-transmitting region and a gas passing-through region, and packings disposed on the substrate so as to surround at least the gas passing-through region. In this case, a space bounded by the lid member, the substrate, and the packings becomes the enclosed space. The pressure application part may further include a gas injecting section connected to the gas passing-through region, the gas injecting section supplying a gas to the enclosed space.

In the element manufacturing apparatus according to the present invention, the element may include the substrate, a plurality of first electrodes each disposed on the substrate, an auxiliary electrode and the protrusion both disposed between the first electrodes, an organic semiconductor layer disposed on the first electrode, and a second electrode disposed on the organic semiconductor layer and the auxiliary electrode. The intermediate product may include the substrate, the plurality of first electrodes disposed on the substrate, the auxiliary electrode and protrusion disposed between the first electrodes, and the organic semiconductor layer disposed on the first electrode and the auxiliary electrode. In this case, the element manufacturing apparatus may further include a removal mechanism that while the lid member is in close contact with the intermediate product, removes the organic semiconductor layer disposed on the auxiliary electrode.

In the element manufacturing apparatus according to the present invention, the auxiliary electrode may be partly covered with the protrusion, and the removal mechanism may include a light irradiator that irradiates with light the organic semiconductor layer on the auxiliary electrode disposed adjacently to the protrusion.

In the element manufacturing apparatus according to the present invention, the protrusion may be at least partly covered with the auxiliary electrode, and the removal mechanism may be configured to remove the organic semiconductor layer on the auxiliary electrode positioned on the protrusion.

In the element manufacturing apparatus according to the present invention, the intermediate product may include the substrate, the protrusion disposed on the substrate, and a layer to be exposed to light, and the element manufacturing apparatus may further include an exposure mechanism that while the lid member is in close contact with the intermediate product, emits exposure light toward the layer to be exposed to light.

In the element manufacturing apparatus according to the present invention, a vapor deposition material may be disposed on the first surface of the lid member, and the element manufacturing apparatus may further include a vapor deposition mechanism that vapor-deposits the vapor deposition material on the substrate by irradiating the vapor deposition material with light while the lid member is in close contact with the intermediate product.

In the element manufacturing apparatus according to the present invention, the lid member supply part may be configured to supply the lid member by a roll-to-roll process.

In the element manufacturing apparatus according to the present invention, the enclosed space may be formed so that it encompasses the intermediate product as viewed along the normal direction of the substrate in the intermediate product.

In the element manufacturing apparatus according to the present invention, the sealing mechanism may include a first sealing jig disposed at a side of the second surface of the lid member, the first sealing jig including a principal plane and a side surface extending from the principal plane, toward the lid member. In this case, the enclosed space as viewed from the normal direction of the substrate in the intermediate product has a profile defined by the side surface of the first sealing jig.

In the element manufacturing apparatus according to the present invention, the sealing mechanism may further include a second sealing jig disposed at the side of the second surface of the lid member, the second sealing jig working with the side surface of the first sealing jig to securely hold the lid member from both sides when the enclosed space is formed.

The element manufacturing apparatus according to the present invention may further include a light irradiator disposed externally to the first sealing jig. In this case, while the first surface of the lid member is in close contact with the intermediate product, the light irradiator irradiates the intermediate product with light through the principal surface of the first sealing jig and the lid member.

In the element manufacturing apparatus according to the present invention, the principal plane of the first sealing jig may include a section that allows light from the light irradiator to pass through, and this section serving as a light-transmitting region constructed of a material having a light-transmitting property. The sealing mechanism may further include a third sealing jig disposed adjacently to the light-transmitting region of the first sealing jig and including an open-and-close controllable window. In this case, when the pressure in the internal space of the first sealing jig is lower than the second pressure, an outer enclosed space blocked from atmospheric air and contiguous to the light-transmitting region of the first sealing jig is formed in an internal space of the third sealing jig and the light irradiator is disposed externally to the outer enclosed space. When the light irradiator irradiates the intermediate product with light, the open-and-close controllable window of the third sealing jig is opened.

In the element manufacturing apparatus according to the present invention, the principal plane of the first sealing jig that includes the section allowing the light from the light irradiator to pass through may be formed by an open-and-close controllable window; the sealing mechanism may further include an auxiliary chamber configured to communicate with an internal space of the first sealing jig when the open-and-close controllable window of the first sealing jig is open; and the light irradiator may be placed inside the auxiliary chamber. In this case, when the first sealing jig is out of contact with the lid member, the open-and-close controllable window of the first sealing jig is closed. By contrast, when the light irradiator irradiates the intermediate product with light, the open-and-close controllable window of the first sealing jig is open and a pressure in the internal space of the first sealing jig and a pressure in an internal space of the auxiliary chamber are controlled to a second pressure higher than the first pressure.

Effect of the Invention

According to the present invention, an element such as an organic semiconductor element can be efficiently manufactured by covering a substrate with a lid member by use of a differential pressure.

DETAILED DESCRIPTION OF THE INVENTION

Hereunder, the embodiment of the present invention will be described with reference to FIGS. 1 to 5(a)-5(d). A layer configuration of an organic semiconductor element 40 manufactured according to the embodiment of the present invention will be first described. Here, a top-emission type of organic electroluminescent (EL) element will be described as an example of the organic semiconductor element 40.

Organic Semiconductor Element

Figure 1:
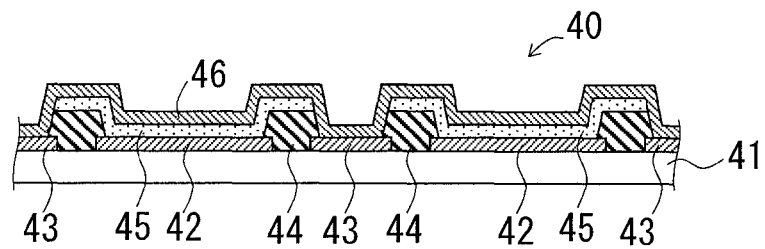
FIG. 1 is a vertical sectional view of an organic semiconductor element manufactured according to an embodiment of the present invention.

As shown in FIG. 1, the organic semiconductor element 40 includes a substrate 41, a plurality of first electrodes 42 disposed on the substrate 41, auxiliary electrodes 43 and protrusions 44 each disposed between the first electrodes 42, organic semiconductor layers 45 each disposed on one of the first electrodes 42, and a second electrode 46 disposed on the organic semiconductor layers 45 and the auxiliary electrodes 43.

The organic semiconductor layers 45 each include at least a light-emitting layer that emits light by recombinations of electrons and holes in organic compounds. Each organic semiconductor layer 45 may further include a hole injection layer, a hole transport layer, an electron transport layer or an electron implantation layer, and other layers generally provided in an organic EL element. Constituent elements of the organic semiconductor layer can be known ones, for example the elements described in JP-A-2011-9498.

One first electrode 42 is disposed for each of the organic semiconductor layers 45. The first electrode 42 functions as a reflecting electrode to reflect the light that has been generated from the organic semiconductor layer 45. Examples of a material constituting the first electrode 42 can include aluminum, chromium, titanium, iron, cobalt, nickel, molybdenum, copper, tantalum, tungsten, platinum, gold, silver, and any other metallic element as used alone, or an alloy of these elements. The first electrode 42 may include a further layer including inorganic oxide, such as indium tin oxide (ITO), indium zinc oxide (IZO), etc., formed on the above metallic layer.

The second electrode 46 functions as a common electrode with respect to the plurality of organic semiconductor layers 45. In addition, the second electrode 46 is configured to transmit the light that has been generated from the organic semiconductor layers 45. Examples of a material constituting the second electrode 46 can include a metallic film that has been thinned to such an extent that it can transmit the light, and an oxide conductive material such as indium tin oxide (ITO).

The auxiliary electrodes 43 are provided to suppress variations in voltage drop due to differences in distances from a power supply (not shown) to the individual organic semiconductor layers, and thus to suppress a variation in luminance of a display device which uses the organic EL element. As shown in FIG. 1, each auxiliary electrode 43 is connected to the second electrode 46. Examples of a material constituting the auxiliary electrode 43 can include substantially the same metallic elements as those which are each used alone in the first electrode 42, or an alloy of these elements. The auxiliary electrode 43 may be formed from the same material as that of the first electrode 42, or may be formed from a material different from that of the first electrode 42.

The protrusions 44 are constructed of a material having an electrical insulating property. In the example of FIG. 1, the protrusions 44 are each disposed between one first electrode 42 and one auxiliary electrode 43. Disposing each protrusion 44 enables electrical insulation between the first electrode 42, the auxiliary electrode 43, and the second electrode 46. The disposition of the protrusions 44 also enables appropriate definition of a shape of the organic semiconductor layers 45 each disposed between the protrusions 44. Examples of a material constituting the protrusions 44 can include an inorganic material such as polyimide, and an inorganic insulating material such as silicon oxide. In addition, the protrusions 44 extend in a normal direction of the substrate 41 and thus when a lid member described later herein is brought into close contact with the substrate 41, the protrusions can also be made to function as spacers to ensure a space between the lid member and the substrate 41.

As shown in FIG. 1, the organic semiconductor layers 45 and the second electrode 46 may be continuously disposed on the protrusions 44 as well as on the first electrodes 42. Of each organic semiconductor layer 45, only a region sandwiched between one first electrode 42 and the second electrode 46 allows an electric current to flow through and emits light, and regions of the organic semiconductor layer 45 that are positioned on the protrusions 44 do not emit light. Only the region of the organic semiconductor layer 45 that emits light is shown in FIGS. 2A and 2B that are described later herein.

Next, construction of the organic semiconductor element 40 when viewed from the normal direction of the substrate 41 is described below. The description focuses particularly upon layout of the auxiliary electrodes 43, protrusions 44, and organic semiconductor layers 45 of the organic semiconductor element 40. FIG. 2A is a plan view of the auxiliary electrodes 43, the protrusions 44, and the organic semiconductor layers 45, the plan view showing the layout of the three sections by way of example. As shown in FIG. 2A, the organic semiconductor layers 45 may be arranged sequentially in matrix form and each may include a rectangular, red organic semiconductor layer 45R, green organic semiconductor layer 45G, and blue organic semiconductor layer 45B. In this case, a combination of adjacent organic semiconductor layers 45R, 45G, and 45B constitutes one pixel.

Figure 2A:
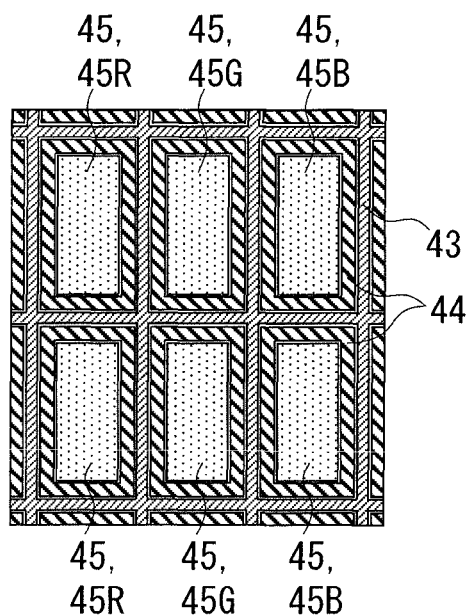
FIG. 2A is a plan view of auxiliary electrodes, protrusions, and organic semiconductor layers of the organic semiconductor element shown in FIG. 1, the plan view showing an example of layout of the three sections.
Figure 2B:
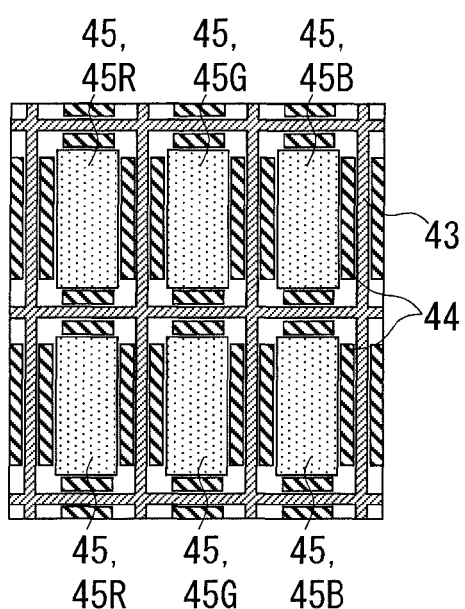
FIG. 2B is a plan view of the auxiliary electrodes, protrusions, and organic semiconductor layers of the organic semiconductor element shown in FIG. 1, the plan view showing another example of layout of the three sections.

As shown in FIG. 2A, the auxiliary electrodes 43 are arranged in grid form in such a way as to extend between the organic semiconductor layers 45 arranged in the matrix form. Location-specific differences in magnitude of the voltage drop across the second electrode 46 connected to the organic semiconductor layers 45 can be suppressed by arranging the auxiliary electrodes 43 in that way. Additionally, as shown in FIG. 2A, the protrusions 44 are each disposed between one organic semiconductor layer 45 and one auxiliary electrode 43 so as to surround the organic semiconductor layer 45 from a side. In other words, each protrusion 44 is continuously disposed along four sides of the organic semiconductor layer 45. Thus in the step of removing the organic semiconductor layer 45 positioned on the auxiliary electrode 43, the organic semiconductor material that has been dispersed can be prevented from reaching the organic semiconductor layer 45 on the first electrode 42.

As long as the voltage drop can be appropriately reduced, the auxiliary electrode 43 does not need to be connected to the second electrode 46 over an entire region of the auxiliary electrode 43. That is to say, not all of the organic semiconductor layer 45 on the auxiliary electrode 43 requires removal in the removing step detailed later herein. As shown in FIG. 2B, therefore, the protrusion 44 may be discontinuously disposed along the four sides of the organic semiconductor layer 45. In the example of FIG. 2B as well, in the step of removing the organic semiconductor layer 45 on the auxiliary electrode 43 positioned between the protrusions 44, the organic semiconductor material that has been dispersed can be prevented from reaching the organic semiconductor layer 45 on the first electrode 42. In addition, the voltage drop can be appropriately suppressed by connecting to the second electrode 46 the auxiliary electrode 43 positioned between the protrusions 44.

Next, an element manufacturing apparatus 10 and an element manufacturing method according to the embodiment, both intended to form the organic semiconductor element 40 on the substrate 41, will be described. Provided that impurities can be sufficiently prevented from entering the organic semiconductor element 40, although an environment in which the element manufacturing method is executed is not limited, the element manufacturing method is executed, for example, partially under a vacuum environment. For example, as long as the environment has a pressure lower than atmospheric pressure, although the more specific pressure in the vacuum environment is not limited, the element manufacturing apparatus 10 has an internal pressure of, for example, $1.0 \times 10^4$ Pa or less.

Element Manufacturing Apparatus

Figure 3:
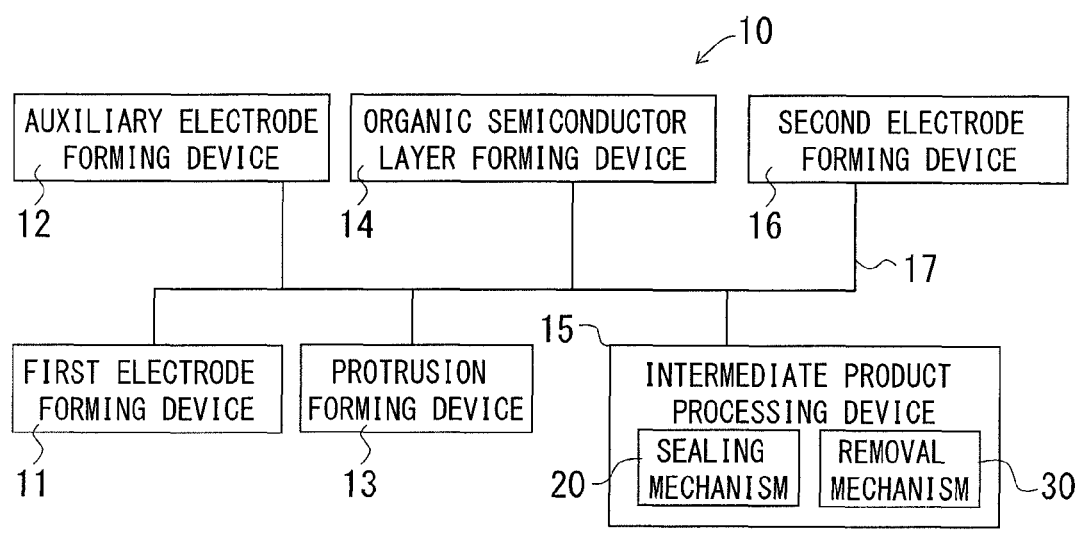
FIG. 3 is a diagram showing a configuration of an element manufacturing apparatus according to the embodiment of the present invention.

FIG. 3 is a diagram showing schematically a configuration of the element manufacturing apparatus 10. As shown in FIG. 3, the element manufacturing apparatus 10 includes: a first electrode forming device 11 that forms a plurality of the first electrodes 42 on the substrate 41; an auxiliary electrode forming device 12 that forms the auxiliary electrode 43 between the first electrodes 42; a protrusion forming device 13 that forms the protrusion 44 between the first electrode 42 and the auxiliary electrode 43; and an organic semiconductor layer forming device 14 that forms the organic semiconductor layer 45 on the first electrode 42, the auxiliary electrode 43, and the protrusion 44. In the following description, an object obtained in steps that use the devices 11, 12, 13, and 14 may be termed the intermediate product 50. The intermediate product 50 that has undergone processing in the first electrode forming device includes the substrate 41 and a plurality of the first electrodes 42 each disposed on the substrate 41. The intermediate product 50 that has undergone processing in the auxiliary electrode forming device 12 further includes the auxiliary electrode 43 formed between the first electrodes 42. The intermediate product 50 that has undergone processing in the protrusion forming device 13 further includes the protrusion 44 formed between the first electrode 42 and the auxiliary electrode 43. The intermediate product 50 that has undergone processing in the organic semiconductor layer forming device 14 further includes the organic semiconductor layer 45 formed on the auxiliary electrode 43 and the protrusion 44. In addition, when processing of the intermediate product 50 in an intermediate product processing device 15 is completed, the organic semiconductor layer 45 disposed on the auxiliary electrode 43 will have already been removed from the intermediate product 50.

The element manufacturing apparatus 10 further includes the intermediate product processing device 15 that performs predetermined processing while a lid member 21c described later herein is stacked upon the substrate 41. Here, a description will be given below of an example in which the intermediate product processing device 15 in the present embodiment is configured as a removal device to remove the organic semiconductor layer 45 disposed on the auxiliary electrode 43. In the present embodiment, the intermediate product processing device 15 includes: a sealing mechanism 20 that brings the lid member 21c (described in detail later herein) into close contact with the intermediate product 50, at a side where the protrusion 44 is provided, the intermediate product 50 including the substrate 41 and the protrusion 44; and a removal mechanism 30 that removes the organic semiconductor layer 45 disposed on the auxiliary electrode 43. In addition, the element manufacturing apparatus 10 further includes a second electrode forming device 16 that after the removal of the organic semiconductor layer 45 disposed on the auxiliary electrode 43, forms a second electrode 46 on the auxiliary electrode 43 and over remaining regions of the organic semiconductor layer 45.

As shown in FIG. 3, the element manufacturing apparatus 10 may further include a transport device 17 connected to the devices 11 to 16 in order to transport the substrate 41 and the intermediate product 50 between the devices 11 to 16.

FIG. 3 is a diagram representing a classification of the devices as viewed from a functional perspective, and the example shown in FIG. 3 does not limit a physical state of these devices. For example, more than one of the devices 11 to 16 shown in FIG. 3 may be physically configured as one device. Alternatively, any one or more of the devices 11 to 16 shown in FIG. 3 may be physically configured as a plurality of devices. For example, as will be described later herein, at least one of the first electrodes 42 and at least one of the auxiliary electrodes 43 may be formed at the same time in one step. In this case, the first electrode forming device 11 and the auxiliary electrode forming device 12 may be configured collectively as one device.

Element Manufacturing Method

Figure 4A:
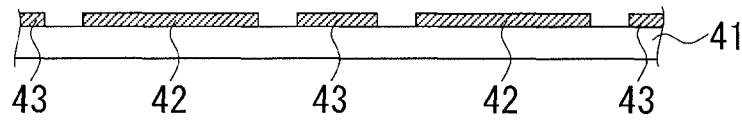
FIGS. 4(a) to 4(g) show various steps that constitute an element manufacturing method according to the embodiment of the present invention.

The method of manufacturing the organic semiconductor element 40 using the element manufacturing apparatus 10 will be described below with reference to FIGS. 4(a) to 4(g). First, a layer of a metallic material which constitutes first electrodes 42 and auxiliary electrodes 43 is formed on the substrate 41 by use of a sputtering method, for example, and then the layer of the metallic material is molded by etching. Thus the first electrodes 42 and the auxiliary electrodes 43 can be formed at the same time on the substrate 41, as shown in FIG. 4(a). The first electrodes 42 and the auxiliary electrodes 43 may be formed in steps independent of each other.

Figure 4B:
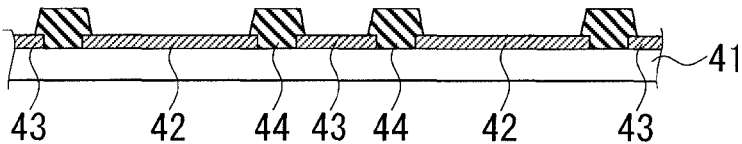
Figure 4C:
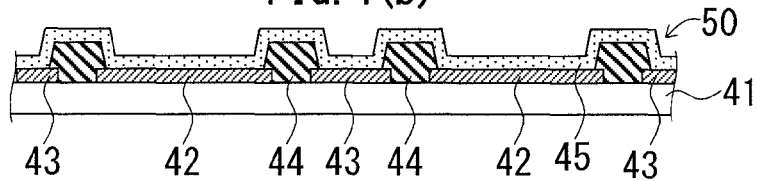

Next as shown in FIG. 4(b), a plurality of protrusions 44 each extending to a region above one of the first electrodes 42 and one of the auxiliary electrodes 43, in a normal direction of the substrate 41, are formed between the first electrode 42 and the auxiliary electrode 43 by means of photolithography, for example. After the formation of the protrusions 44, as shown in FIG. 4(c), an organic semiconductor layer 45 is formed on the first electrodes 42, the auxiliary electrodes 43, and the protrusions 44, by use of a general film-forming method such as physical vapor deposition, chemical vapor deposition (CVD), printing, inkjet coating, or transfer. In this manner, an intermediate product 50 can be obtained that includes the substrate 41, the first electrodes 42 disposed on the substrate 41, the auxiliary electrodes 43 and protrusions 44 each disposed between the first electrodes 42, and the organic semiconductor layer 45 disposed on the first electrode 42, the auxiliary electrode 43, and the protrusion 44. In the present embodiment, as described above, the first electrodes 42 and the auxiliary electrodes 43 are formed on the substrate 41 earlier than the protrusions 44. Accordingly the first electrodes 42 and the auxiliary electrodes 43 are partly covered with the protrusions 44.

Figure 4D:
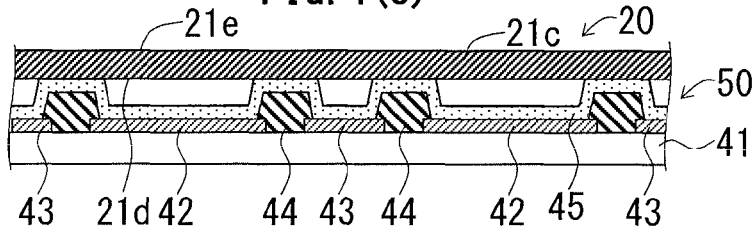
Figure 4E:
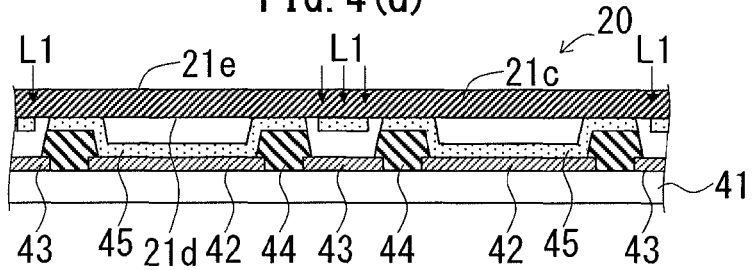

Next, a lid member 21c is provided and then as shown in FIG. 4(d), a close-fitting step is executed to bring a first surface 21d of the lid member 21c into close contact with the intermediate product 50 via the sealing mechanism 20. Next, while as shown in FIG. 4(e) the lid member 21c is in close contact with the intermediate product 50, the organic semiconductor layer 45 disposed on one of the auxiliary electrodes 43 is irradiated with light L1 such as laser light, by use of the removal mechanism 30. Energy from the light L1 is then absorbed by the organic semiconductor layer 45, and consequently the organic semiconductor material constituting the organic semiconductor layer 45 on the auxiliary electrode 43 is dispersed. In this way, the step of removing the organic semiconductor layer 45 on the auxiliary electrode 43 can be executed. The organic semiconductor material that has been dispersed from the auxiliary electrode 43 sticks to the first surface 21d of the lid member 21c, as shown in FIG. 4(e), for example. After that, as described in detail later, the second electrode 46 is formed on the organic semiconductor layers 45 positioned on the first electrodes 42, and on the auxiliary electrodes 43.

Hereunder, the method of removing a part of the organic semiconductor layers 45 on the auxiliary electrodes 43 while maintaining the lid member 21c in close contact with the intermediate product 50, as described per FIGS. 4(d) and 4(e), will be described in further detail with reference to of FIGS. 5(a) to 5(e).

Sealing Mechanism

Figure 5A:
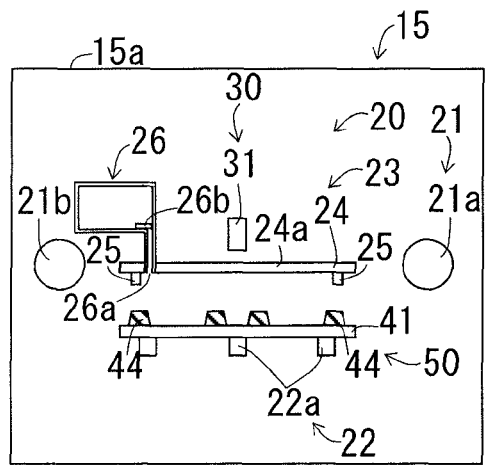
FIGS. 5(a) to 5(d) show various steps including the step of removing an organic semiconductor layer on an auxiliary electrode in the embodiment of the present invention.

The sealing mechanism 20 is first described here. As shown in FIG. 5(a), the sealing mechanism 20 includes a lid member supply part 21 that supplies the lid member 21c, and a pressure application part 23 that applies a pressure to the lid member 21c to bring its first surface 21d into close contact with the intermediate product 50. The lid member 21c is disposed to cover the intermediate product 50 at the side where the protrusions 44 are provided. Since the lid member 21c is used for this purpose, any fragments of the organic semiconductor material that may have been dispersed from the auxiliary electrodes 43 can be prevented from contaminating a surrounding environment as well as the organic semiconductor layers 45 on the first electrodes 42, in the above removing step, for example. A light-transmissive material such as a glass film or plastic is used to constitute the lid member 21c.

The lid member supply part 21 may be configured to supply the lid member 21c by a roll-to-roll process. For example, the lid member supply part 21 may include an unwinder 21a that unwinds the lid member 21c, and a take-up section 21b that rewinds the lid member 21c. In this case, the lid member 21c has its material and thickness set to be such flexible so that it can be wound into roll form.

As shown in FIG. 5(a), the pressure application part 23 includes a substrate 24 including a light-transmitting region 24a and a gas passing-through region 24b, and packings 25 disposed on the substrate 24 so as to surround at least the gas passing-through region 24b. The packings 25 are disposed on the substrate 24 at a side facing the lid member 21c. The pressure application part 23 further includes a gas injecting section 26 connected to the gas passing-through region 24b. The gas injecting section 26 supplies a gas such as an inert gas to a space between the substrate 24 and the lid member 21c. The substrate 24 is formed from a light-transmissive material, for example, glass of quartz or the like. The packings 25 are formed from a material, for example rubber, that can come into firm contact with the second surface 21e of the lid member 21c and thereby enhance gastightness of the space between the substrate 24 and the lid member 21c.

Removal Mechanism

Next, the removal mechanism 30 is described below. The removal mechanism 30 removes one of the organic semiconductor layers 45 on the auxiliary electrodes 43 by irradiating the particular organic semiconductor layer 45 with the light L1 such as laser light, through the substrate 24 and the lid member 21c. As shown in FIG. 5(a), the removal mechanism 30 includes a light irradiator 31 that generates laser light, for example. Examples of a material constituting the lid member 21c include a light-transmissive material such as polyethylene terephthalate (PET), cycloolefin polymer (COP), polypropylene (PP), polyethylene (PE), poly carbonate (PC), or glass film, so as to enable the light L1 such as laser light to pass through the lid member 21c.

The lid member 21c preferably has a predetermined gas barrier property to prevent a decrease in gastightness of the space between the intermediate product 50 and the lid member 21c due to an inflow of a gas from the lid member 21c, and to prevent elements of the intermediate product 50 from suffering deterioration due to oxidation or other reasons. For example, the lid member 21c preferably has a maximum oxygen transmission rate of 100 cc/m$^2$·day, which is more preferably down to 30 cc/m$^2$·day and further preferably down to 15 cc/m$^2$·day.

Operation of the intermediate product processing device 15 is next described below.

Figure 5B:
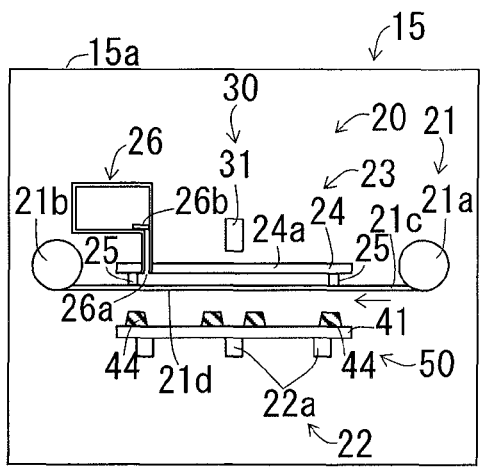
Figure 5C:
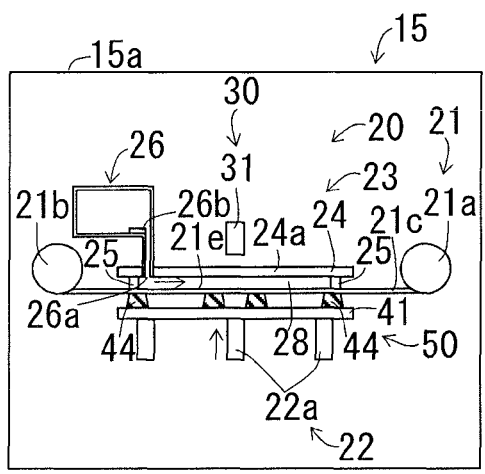

First as shown in FIG. 5(a), the device 15 transports the intermediate product 50 to a chamber 15a containing the sealing mechanism 20 and the removal mechanism 30 and maintained in a vacuum environment. Next as shown in FIG. 5(b), the device 15 unwinds the lid member 21c from the unwinder 21a, toward the take-up section 21b, and covers the intermediate product 50 with the first surface 21d of the lid member 21c from the protrusion side. After covering, the device 15 brings the intermediate product 50 into relative close proximity to the lid member 21c and abuts both. Thus, as shown in FIG. 5(c), an enclosed space 28 hermetically sealed from surroundings can be formed in a space contiguous to the second surface 21e of the lid member 21c that is present on an opposite side of the lid member 21c with respect to the first surface 21d, that is, more specifically a space enclosed by the lid member 21c, the substrate 24, and the packings 25. The way the device 15 brings the intermediate product 50 into relative close proximity to the lid member 21c is not limited. For example, if as shown in FIG. 5(c) the intermediate product 50 is supported by a support member 22 including a plurality of telescopic cylinders 22a, extending the cylinders 22a allows the intermediate product 50 to be brought into contact with the lid member 21c.

After the formation of the enclosed space 28, the device 15 uses the gas injecting section 26 to inject a gas into the enclosed space 28 and enhance an internal pressure of the enclosed space. This results in the internal pressure of the enclosed space 28 becoming higher than that of the space between the lid member 21c and the intermediate product 50. Accordingly the first surface 21d of the lid member 21c can be brought into strong and close contact with intermediate product 50 in the close-fitting step. The gas injecting section 26 may include a shutter 26b, as shown in FIG. 5(c), to control the injection of the gas from an injection port 26a into the enclosed space 28.

Figure 4F:
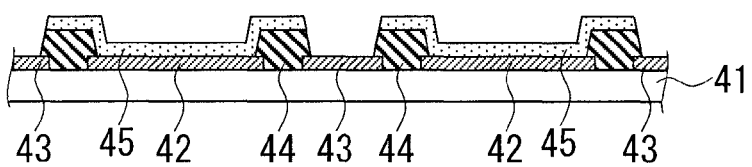
Figure 5D:
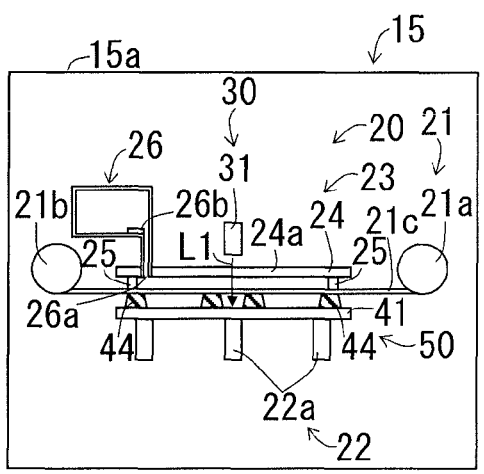

Next while holding the lid member in close contact with the intermediate product 50, the device 15 uses the light irradiator 31 of the removal mechanism 30 to irradiate with the light L1 the organic semiconductor layers 45 that are disposed on the auxiliary electrodes 43. FIGS. 5(d) and 4(e) show the irradiation state. After the irradiation, part of the organic semiconductor layers 45 on the auxiliary electrodes 43 can be removed under the vacuum environment. FIG. 4(f) shows the state where a part of the organic semiconductor layers 45 on the auxiliary electrodes 43 has been removed.

Figure 4G:
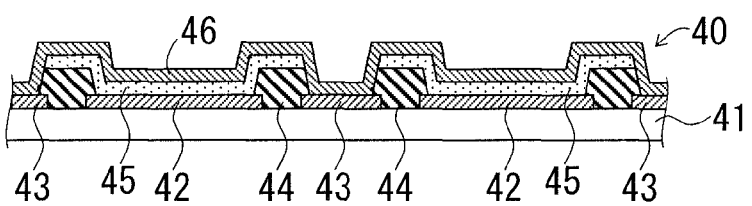

After the above removal, as shown in FIG. 4(g) the second electrode 46 is formed on the organic semiconductor layers 45 positioned on the first electrodes 42, and on the auxiliary electrodes 43. In this manner, the organic semiconductor element 40 with the auxiliary electrodes 43 connected to the second electrode 46 can be obtained.

In the present embodiment, since the enclosed space 28 having a pressure higher than the internal pressure of the element manufacturing apparatus 10 is formed inside the apparatus 10 that executes a plurality of process steps under an environment of a lower pressure than atmospheric pressure, the lid member 21c can be brought into strong and close contact with the intermediate product 50 by utilizing a differential pressure. Accordingly, various processes such as the removing step can be performed upon the intermediate product 50 with the lid member 21c in strong and close contact therewith. This allows the suppression of contamination of both the formed organic semiconductor layers 45 and the surrounding environment of the intermediate product 50.

Comparative Embodiment

Figure 6A:
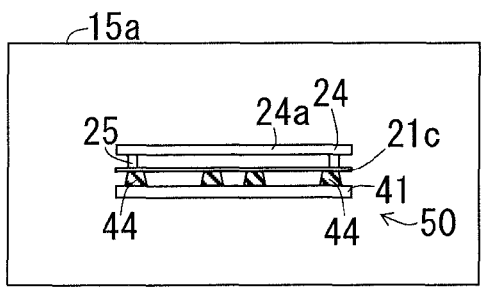
FIGS. 6(a) and 6(b) show various steps including the step of removing an organic semiconductor layer on an auxiliary electrode in a comparative embodiment.
Figure 6B:
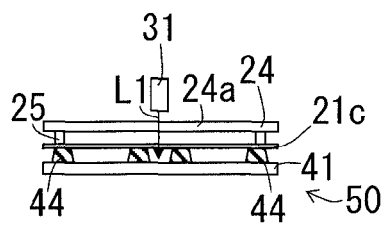

Next, advantageous effects of the present embodiment will be described on a comparison basis with respect to those of a comparative embodiment. FIGS. 6(a) and 6(b) show steps including the step of removing an organic semiconductor layer 45 on an auxiliary electrode 43 in the comparative embodiment.

In the comparative embodiment that FIGS. 6(a) and 6(b) show, after a lid member 21c has been brought into close contact with an intermediate product 50 to form an overlay substrate, this overlay substrate is taken out from a vacuum environment maintained in a space between the lid member 21c and the intermediate product 50, into the atmospheric air, and then the organic semiconductor layer 45 on the auxiliary electrode 43 is irradiated with light in the air. In the comparative embodiment shown in FIGS. 6(a) and 6(b), the same elements as those of the present embodiment shown in FIG. 1 to FIGS. 5(a)-5(d) are each assigned the same reference number and detailed description of these elements is omitted.

In the comparative embodiment, when the overlay substrate is taken out into the air and loaded again, a time is needed to replace an internal atmosphere of the element manufacturing apparatus and/or to remove air therefrom. For this reason, the time and costs required for the manufacture of the organic semiconductor element are considered to increase. In addition, since the overlay substrate is temporarily taken out into the atmospheric air, the lid member 21c needs cutting after the formation of the overlay substrate. This makes it difficult for the device 15 to rewind the lid member 21c that has once been unwound and used, that is, to recover the lid member 21c by a roll-to-roll process. Accordingly a way to collect the lid member 21c is limited.

By contrast, in the present embodiment, the step of removing the organic semiconductor layer 45 on the auxiliary electrode 43 can be executed under the environment of a lower internal pressure of the element manufacturing apparatus than atmospheric pressure. As a result, the element such as the organic semiconductor element 40 can be manufactured efficiently, which in turn enables roll-to-roll supply of the lid member 21c. In the present embodiment, therefore, any one of various methods including roll-to-roll supply and sheet-by-sheet supply can be used to supply the lid member 21c.

A variety of changes and the like may be introduced in the above embodiment. The following will describe modifications based on part of the accompanying drawings. In the following description and the drawings used therein, the same reference numbers as assigned to the elements that can be configured similarly and equivalently to those of the above embodiment will be used for these corresponding elements of the above embodiment, and overlapped description of these elements will be omitted. In addition, where the operational effects obtained in the above embodiment can also be obviously obtained in the modifications, description of these effects may be omitted.

A Modification of the Layer Configuration in the Organic Semiconductor Element

The example where the first electrodes 42 and the auxiliary electrodes 43 are formed on the substrate 41 earlier than the protrusions 44 has been shown and described in the above embodiment. This example, however, is not restrictive and in a modification, the protrusions 44 may be formed on the substrate 41 earlier than the first electrodes 42 and the auxiliary electrodes 43. The close-fitting step and removing step in the embodiment can be used in such a modification as well. This modification will be described below with reference to FIGS. 7(a) to 7(g).

Figure 7A:
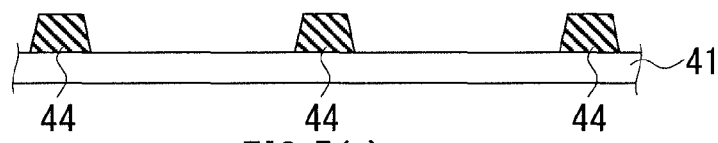
FIGS. 7(a) to 7(g) show various steps including the step of removing an organic semiconductor layer on an auxiliary electrode in a modification of the embodiment of the present invention.
Figure 7B:
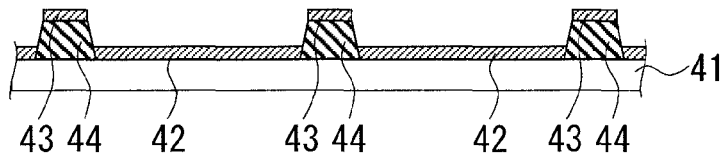
Figure 7C:
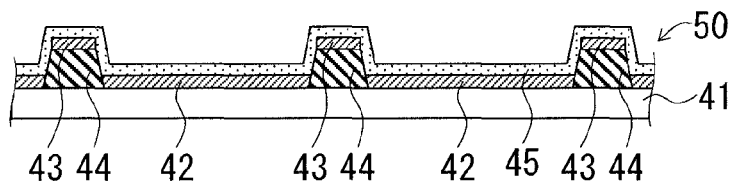

First as shown in FIG. 7(a), a plurality of protrusions 44 are formed on a substrate 41. Next as shown in FIG. 7(b), a first electrode 42 is formed between the protrusions 44. In addition, an auxiliary electrode 43 is formed on each of the protrusions 44. After the formation of the electrodes 42 and 43, as shown in FIG. 7(c), an organic semiconductor layer 45 is formed on the first electrodes 42, the auxiliary electrodes 43, and the protrusions 44. In this way, an intermediate product 50 can be obtained that includes the substrate 41, the first electrodes 42 disposed on the substrate 41, the auxiliary electrodes 43 and protrusions 44 disposed between the first electrodes 42, and the organic semiconductor layer 45 disposed on the first electrode 42 and the auxiliary electrode 43. In the present modification, the protrusions 44 are formed earlier than the first electrodes 42 and the auxiliary electrodes 43, and thus the protrusions 44 are covered with the auxiliary electrodes 43. The protrusions 44 do not need to have their upper surfaces covered with the auxiliary electrodes 43 over respective entire regions. In other words, the upper surfaces of the protrusions 44 need only to be at least partly covered with the auxiliary electrodes 43. In addition, an example of disposing the protrusions 44 in two rows between the first electrodes 42 and disposing the auxiliary electrode 43 between the protrusions 44 has been shown and described in the above embodiment, but in the present modification, since one auxiliary electrode 43 is disposed on each of the protrusions 44, the protrusions 44 may only be disposed in one row between the first electrodes 42, as shown in FIG. 7(c).

Figure 7D:
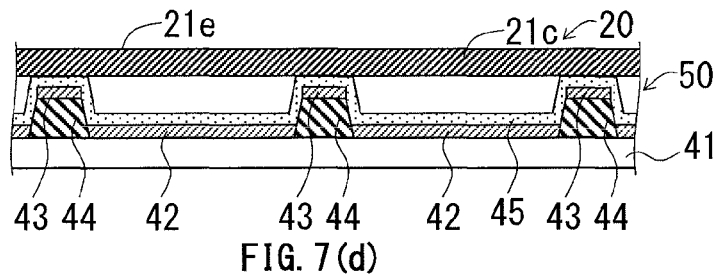
Figure 7E:
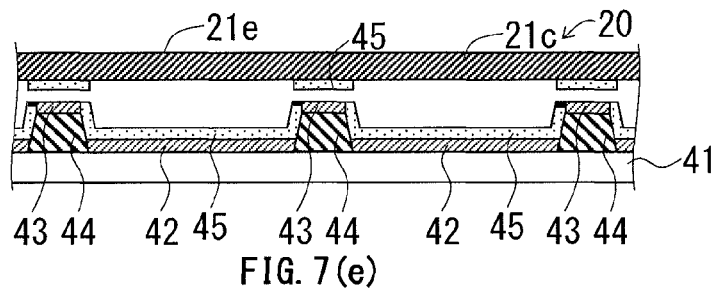
Figure 7F:
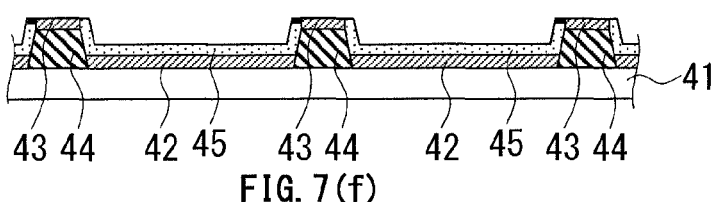

The close-fitting step is next executed to bring the first surface 21d of the lid member 21c into close contact with the intermediate product 50. More specifically, as shown in FIG. 7(d), the first surface 21d of the lid member 21c is abutted upon the organic semiconductor layer 45 disposed on the auxiliary electrodes 43 lying on the protrusions 44. During the abutting of the first surface 21d, the lid member 21c is, as in the above embodiment, is brought into strong and close contact with the intermediate product 50 by use of a differential pressure. In this case, as shown in FIG. 7(e), the organic semiconductor layer 45 on the auxiliary electrodes 43 positioned on the protrusions 44 can be transferred to the first surface 21d of the lid member 21c by setting appropriate surface energy of the first surface 21d. That is to say, in the present modification, the transfer can be used to execute the step of removing a part of the organic semiconductor layer 45 disposed on the auxiliary electrodes 43 on the protrusions 44. FIG. 7(f) shows the state where a part of the organic semiconductor layer 45 on the auxiliary electrodes 43 on the protrusions 44 has been removed. In the present modification as well, the organic semiconductor layer 45 disposed on the auxiliary electrodes 43 on the protrusions 44 may be irradiated with light for accelerated transfer, as in the above embodiment.

Figure 7G:
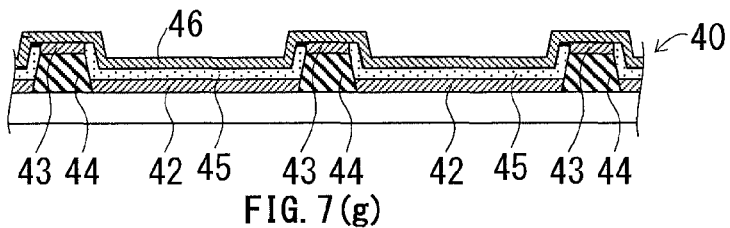

Then, as shown in FIG. 7(g), the second electrode 46 is formed on the organic semiconductor layer 45 overlaid on the first electrodes 42, and on the auxiliary electrodes 43 overlaid on the protrusions 44. In this manner, the organic semiconductor element 40 with the auxiliary electrodes 43 connected to the second electrode 46 can be obtained.

While the example where the organic semiconductor layer 45 removed is in contact with the auxiliary electrodes 43 has been shown and described in the above embodiment and in the present modification, this example is not limitative and any other layer that is not shown, such as a layer having an electrically conductive property, may be interposed between the organic semiconductor layer 45 removed and the auxiliary electrodes 43. Briefly the phrasing of "removing the organic semiconductor layer disposed on the auxiliary electrodes" as used herein means removing the organic semiconductor layer region that appears as if it overlapped with the auxiliary electrodes when viewed along the normal direction of the substrate.

Figure 8:
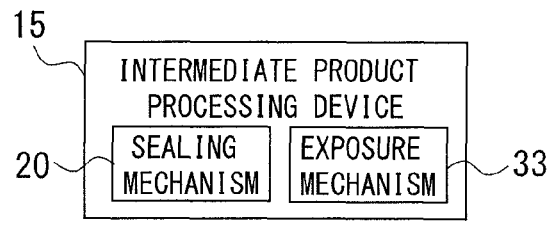
FIG. 8 is a diagram showing an example in which an intermediate product processing device including a sealing mechanism is configured as an exposure device to expose an intended layer to light.
Figure 9:
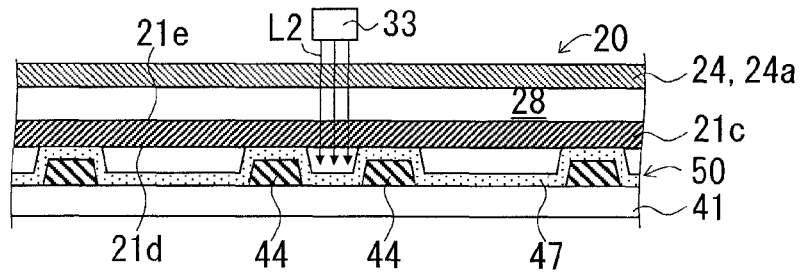
FIG. 9 is a diagram showing an exposure step executed by the exposure device shown in FIG. 8.

A Modification in which the Intermediate Product Processing Device is Configured as an Exposure Device The examples where the intermediate product processing device 15 with the sealing mechanism 20 is configured as the removal device to remove part of the organic semiconductor layers 45 on the auxiliary electrodes 43, have been shown and described in the above embodiment and in a modification. These examples, however, do not limit applications of the sealing mechanism 20. For example as shown in FIGS. 8 and 9, the intermediate product processing device 15 may include the sealing mechanism 20 and an exposure mechanism 33 that executes an exposure step in which it irradiates an intended layer 47 with exposure light L2 while the lid member 21c is in close contact with the intermediate product 50. In other words, the above-described close fitting method using the differential pressure inside the element manufacturing apparatus 10 may be applied on behalf of the exposure step.

Figure 10:
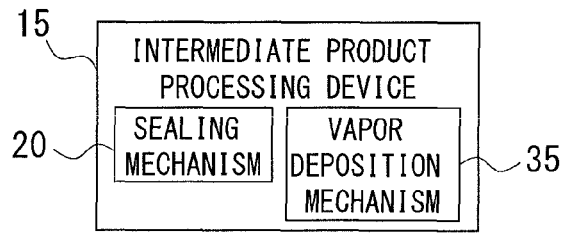
FIG. 10 is a diagram showing an example in which the intermediate product processing device including the sealing mechanism is configured as a vapor deposition device to vapor-deposit a material on a substrate.
Figure 11A:
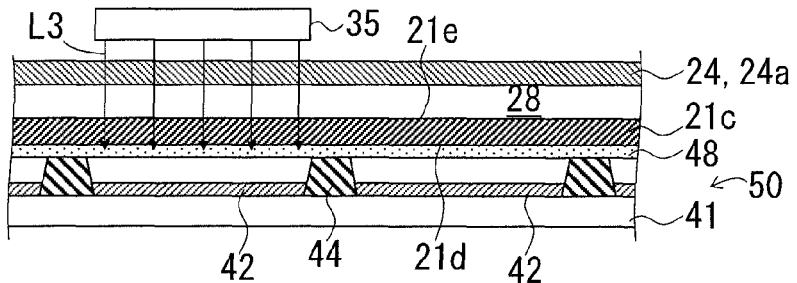
FIG. 11 (a), (b) are diagrams showing a vapor deposition step executed by the vapor deposition device shown in FIG. 10.
Figure 11B:
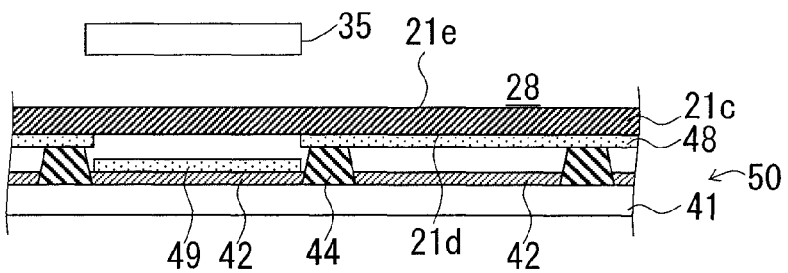

A Modification in which the Intermediate Product Processing Device is Configured as a Vapor Deposition Device In an alternative example, as shown in FIGS. 10, 11(a), and 11(b), the intermediate product processing device 15 may include the sealing mechanism 20 and a vapor deposition mechanism 35 that vapor-deposits an intended material 48 on the substrate 41 by irradiating the intended material 48 with light while the lid member 21c is in close contact with the intermediate product 50. In other words, the close fitting method using the differential pressure inside the element manufacturing apparatus 10 may be applied on behalf of a vapor deposition step. A method that includes disposing a predetermined material on a flexible member such as the lid member 21c, then heating and evaporating the predetermined material, and thereby depositing the material on another member, is called "sublimation transfer" in the field of printing. The terms "evaporation" and "vapor deposition" as used in the description of the present modification can therefore be read to mean "sublimation" and "sublimation transfer", respectively.

In the present modification, as shown in FIG. 11(a), the vapor deposition material 48 is disposed on a first surface 21d of the lid member 21c. In addition, as shown in FIG. 11(a), the intermediate product 50 includes the substrate 41, the plurality of protrusions 44 disposed on the substrate 41, and the first electrode 42 disposed between the protrusions 44. In this case, the vapor deposition material 48 will evaporate when it is irradiated with light L3 such as infrared rays by use of the vapor deposition mechanism 35. More specifically as shown in FIG. 11(a), when a region of the vapor deposition material 48 that is present at a position facing one of the first electrodes 42 is irradiated with the light L3, the vapor deposition material 48 will evaporate and stick to that first electrode 42 on the substrate 41. As a result, a vapor-deposited layer 49 can be formed on the corresponding first electrode 42, as shown in FIG. 11(b). Additionally a space between the substrate 41 and the lid member 21c is appropriately partitioned by the protrusions 44. This prevents the vapor deposition material 48 from being dispersed over a wide region in the space between the substrate 41 and the lid member 21c. A method of heating the vapor deposition material 48 is not limited to the method described above. For example, the vapor deposition material 48 may be deposited by forming in advance an infrared-light absorbing metallic thin film on a lower section of the vapor deposition material 48 to heat the metallic thin film. In other words, the step of "irradiating the vapor deposition material 48 with the light L3" in the present modification includes, in addition to the step of irradiating the vapor deposition material 48 directly with the light, emitting the light toward the vapor deposition material 48 so that the light reaches a member adjacent thereto.

Other Modifications

The examples where the substrate 41 is supplied on a sheet-by-sheet basis have been shown and described in the above embodiment and modifications. These examples, however, are not restrictive and the substrate 41 may be supplied by a roll-to-roll process. In this case, use of a movable stage configured to make the substrate 41 supplied by a roll-to-roll process approach the lid member 21c allows the substrate 41 to be partly covered with the lid member 21c in a manner similar to that employed in the embodiment and the modifications.

The examples where the organic semiconductor element 40 is an organic electro-luminescence (EL) element have been shown and described in the above embodiment and modifications. These examples, however, do not limit the types of organic semiconductor elements manufactured using the above-described element manufacturing apparatus 10 and element manufacturing method. For example, organic transistor devices, organic solar-cell devices, and other organic semiconductor elements can be manufactured using the element manufacturing apparatus 10 and the element manufacturing method. The organic semiconductor layer and other elements used in an organic transistor device can therefore be known ones, which may be the organic semiconductor layer and other elements described in JP-A-2009-87996. Likewise, the photo-electric conversion layer formed from an organic semiconductor layer, and other elements used in an organic solar-cell device can be known ones, which may be the photo-electric conversion layer and other elements described in JP-A-2011-151195. In addition, the element manufacturing apparatus 10 and the element manufacturing method may be applied to manufacturing inorganic semiconductor elements, as well as to manufacturing organic semiconductor elements.

Modifications of the Intermediate Product Processing Device

Figure 12:
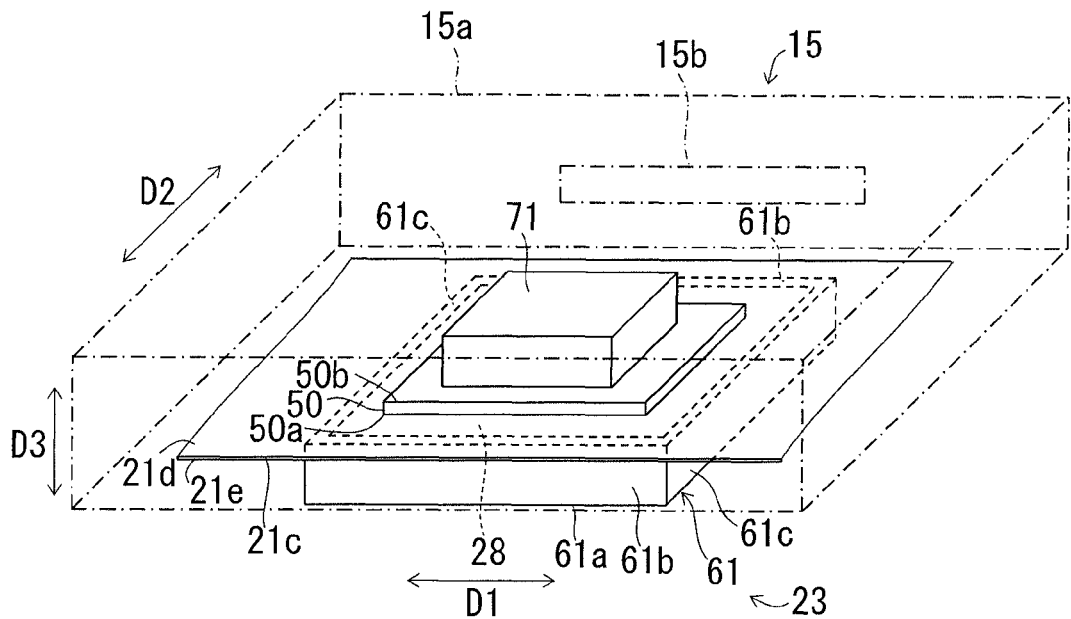
FIG. 12 is a perspective view showing a modification of the intermediate product processing device.

Other modifications of the intermediate product processing device 15 will be described below. First, an intermediate product processing device 15 according to one such modification will be outlined below with reference to FIG. 12. FIG. 12 is a perspective view of main elements constituting the intermediate product processing device 15.

Referring to FIG. 12, a first surface of an intermediate product 50 that faces a first surface 21d of a lid member 21c is denoted by reference number 50a, and a second surface of the intermediate product 50 that lies on a side opposite to the first surface 50a is denoted by reference number 50b. In a chamber 15a of the intermediate product processing device 15 according to the present modification, the intermediate product 50 is retained by a substrate retaining jig 71 at a position above the lid member 21c. The substrate retaining jig 71 is formed so as to be able to come into contact with the second surface 50b of the intermediate product 50 and retain the intermediate product 50, and the substrate retaining jig 71 is an electrostatic chuck, for example. A substrate removal window 15b formed on a side of the chamber 15a through which to load the intermediate product 50 into the chamber 15a is represented with a dashed line to prevent the drawing from becoming complicated. A section of a first sealing jig 61 (described later herein) that becomes hidden and concealed below the lid member 21c according to viewing angle is represented by another form of dashed line.

As shown in FIG. 12, a pressure application part 23 of a sealing mechanism 20 in the intermediate product processing device 15 according to the present modification includes the first sealing jig 61 of a second surface 21e of the lid member 21c. The first sealing jig 61 exists to form, at a side of the second surface 21e of the lid member 21c, the above-described enclosed space 28 hermetically sealed from surroundings. The first sealing jig 61 includes, for example, a principal plane 61a extending in parallel to the lid member 21c, and side surfaces extending from the principal plane 61a to the lid member 21c. The enclosed space 28 in this case is formed in at least a space internal to the side surfaces of the first sealing jig 61. In other words, the enclosed space 28 as viewed from a normal direction of the substrate 41 in the intermediate product 50 has a profile defined by the side surfaces of the first sealing jig 61. The side surfaces of the first sealing jig 61 include, for example, one pair of first side surfaces, 61b, that extend in a first direction D1, and one pair of second side surfaces, 61c, that extend in a second direction D2 orthogonal to the first direction D1. The first direction D1 here refers to a direction in which the lid member supply part 21 transports the lid member 21c. That the first side surfaces 61b extend in the first direction D1 means that an angle formed by the first side surfaces 61b and the first direction D1 is smaller than an angle formed by the first side surfaces 61b and the second direction D2. The angle formed by the first side surfaces 61b and the first direction D1, preferably ranges between −10 degrees and +10 degrees. Similarly, that the second sides 61c extend in the second direction D2 means that an angle formed by the second sides 61c and the second direction D2 is smaller than an angle formed by the second sides 61c and the first direction D1. The angle formed by the second sides 61c and the second direction D2, preferably ranges between −10 degrees and +10 degrees. In FIG. 12, a third direction orthogonal to both the first direction D1 and the second direction D2 is represented by reference number D3.

As shown in FIG. 12, the first side surfaces 61b and second side surfaces 61c of the first sealing jig 61 are each disposed at a position where the side does not overlap the intermediate product 50 when viewed from the normal direction of the substrate 41 in the intermediate product 50. Accordingly, the enclosed space 28 formed in the space internal to the side surfaces of the first sealing jig 61 will be formed so as to encompass the intermediate product 50 when viewed from the normal direction of the substrate 41 in the intermediate product 50.

Figure 13A:
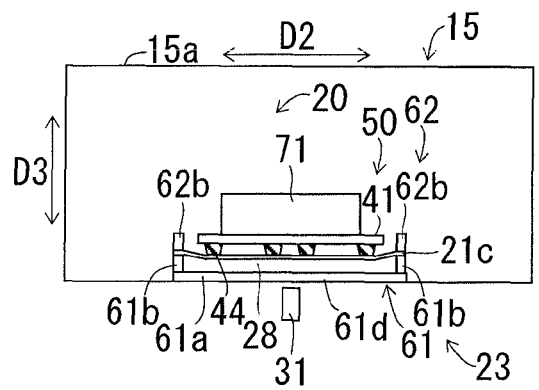
FIG. 13A is a sectional view of the intermediate product processing device shown in FIG. 12, this view showing a state of the device when it is cut in a second direction.

Next, the intermediate product processing device 15 according to the present modification will be described in further detail with reference to FIGS. 13A and 13B. FIG. 13A is a sectional view of the intermediate product processing device 15 in FIG. 12, showing a state of the device 15 when it is cut in the second direction D2, and FIG. 13B is another sectional view of the intermediate product processing device 15 in FIG. 12, showing a state of the device 15 when it is cut in the second direction D2.

Figure 13B:
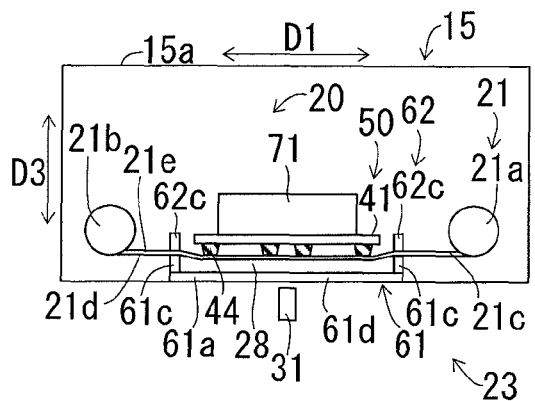
FIG. 13B is another sectional view of the intermediate product processing device shown in FIG. 12, this view showing a state of the device when it is cut in a first direction.

As shown in FIGS. 13A and 13B, a light irradiator 31 is placed externally to the first sealing jig 61. In addition, the principal plane 61a of the first sealing jig 61 includes a section through which light from the light irradiator 31 passes, and this section serves as a light-transmitting region constructed of a material having a light-transmitting property. As with the substrate 24, the first sealing jig 61 uses quartz, for example, as the material having a light-transmitting property.

The pressure application part 23 of the sealing mechanism 20 may further include a second sealing jig of the first surface 21d of the lid member 21c and acting with a side surface of the first sealing jig 61 to hold the lid member 21c from vertical directions of the lid member 21c when the second sealing jig forms the enclosed space 28. Thus the enclosed space 28 can be even more strongly enclosed from surroundings. The second sealing jig 62 is configured as, for example, a frame-shaped member, which includes: a first side surface 62b that acts with a first side surface 61b of the first sealing jig 61 to hold the lid member 21c therebetween; and a second side surface 62c that acts with a second side surface 61c of the first sealing jig 61 to hold the lid member 21c therebetween.

As described above, in the present modification, the enclosed space 28 is formed so that it encompasses the intermediate product 50. Accordingly as shown in FIGS. 13A and 13B, the lid member 21c and the intermediate product 50 can be brought into close contact by pushing the latter toward the principal plane 61a of the first sealing jig 61 which forms the enclosed space 28, and thereby bending the lid member 21c toward the principal plane 61a of the first sealing jig 61. At this time, the lid member 21c sandwiched between the first sealing jig 61 and the second sealing jig 62 becomes strongly retained therebetween, which causes the lid member 21c to generate, against the bending, a repulsive force directed toward the intermediate product 50. In the present modification, the repulsion allows the lid member 21c to be brought into strong and close contact with the intermediate product 50. This in turn allows reliable suppression of the contamination of both the formed organic semiconductor layers 45 and the surrounding environment of the intermediate product 50.

In addition, in the present modification the side surfaces 61b and 61c of the first sealing jig 61 are arranged so as not to overlap the intermediate product 50 when viewed from the normal direction of the substrate 41 in the intermediate product 50. The arrangement prevents the side surfaces 61b and 61c of the first sealing jig 61 from locally pressing the first surface 50a of the intermediate product 50 via the lid member 21c during the close fitting of the lid member 21c to the intermediate product 50. This means that the elements constituting the first surface 50a of the intermediate product 50 are free from damage due to local pressures that would otherwise be applied from the side surfaces 61b and 61c of the first sealing jig 61. Layout of the elements constituting the first surface 50a of the intermediate product 50 can therefore be set with high flexibility.

Next, a method of removing the organic semiconductor layer 45 on an auxiliary electrode 43 by use of the intermediate product processing device 15 according to the present modification will be described with reference to FIGS. 14(a) to 14(f). The intermediate product processing device 15 as cut in the first direction D1 is shown in FIGS. 14(a) to 14(f).

Figure 14A:
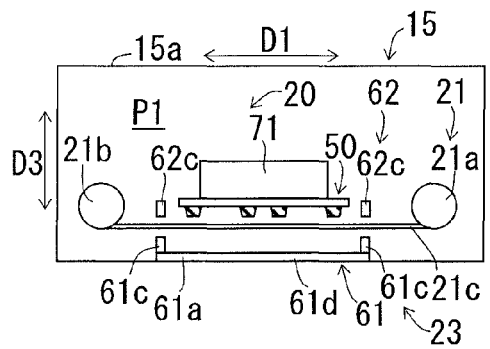
FIGS. 14(a) to 14(f) show various steps including the step of removing an organic semiconductor layer on an auxiliary electrode by use of the intermediate product processing device shown in FIG. 12.

A preparatory step is executed first. As shown in FIG. 14(a), the preparatory step includes positioning the intermediate product 50 properly in the chamber 15a, then transporting the lid member 21c in the first direction D1 from the unwinder 21a, toward the take-up section 21b, and thereby opposing the first surface 21d of the lid member 21c to the intermediate product 50. In this step, the internal pressure of the chamber 15a is controlled to a first pressure P1. For suppressed entry of impurities into the intermediate product 50, the first pressure P1 is preferably set to be a maximum of $1 \times 10^2$ Pa or further preferably set to be below $1 \times 10^{-1}$ Pa.

Figure 14B:
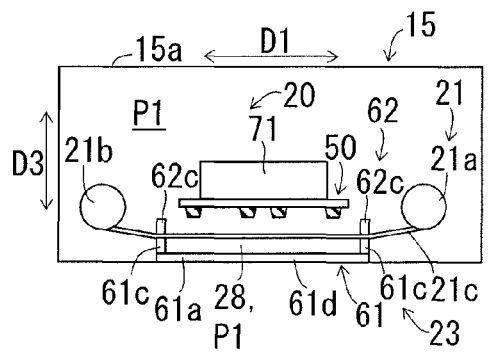

Next as shown in FIG. 14(b), an enclosed-space forming step for forming the enclosed space 28 that borders the second surface 21e of the lid member 21c is executed by bringing the first sealing jig 61 into contact with the second surface 21e of the lid member 21c under the chamber environment controlled to the first pressure P1. To be more specific, the second sealing jig 62 is moved toward the first sealing jig 61 so that the lid member 21c is sandwiched between a side surface of the first sealing jig 61 and that of the second sealing jig 62. The internal pressure of the enclosed space 28 at this time is held at the first pressure P1.

Figure 14C:
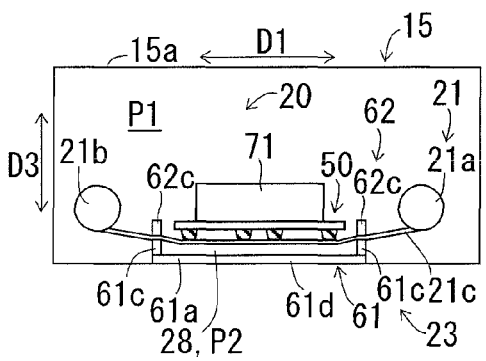

After the formation of the enclosed space 28, as shown in FIG. 14(c), the intermediate product 50 is moved toward the lid member 21c using the substrate retaining jig 71 to bring the first surface 21d of the lid member 21c into contact with the intermediate product 50. In addition, the internal pressure of the enclosed space 28 is raised to a second pressure P2 higher than the first pressure P1. At this time, the internal pressure of the space between the intermediate product 50 and the first surface 21d of the lid member 21c is equal to the first pressure P1, so that the first surface 21d of the lid member 21c can be brought into strong and close contact with the intermediate product 50 on the basis of the difference between the first pressure P1 and the second pressure P2. In this close-fitting step, the difference between the first pressure P1 and the second pressure P2 is preferably set to be at least $1 \times 10^1$ Pa or further preferably set to be at least $1 \times 10^2$ Pa. Although not shown, a gas injecting section that injects a gas into the enclosed space 28 is connected to the first sealing jig 61. An exhaust section that releases the gas from the enclosed space 28 may also be connected to the first sealing jig 61.

Figure 14D:
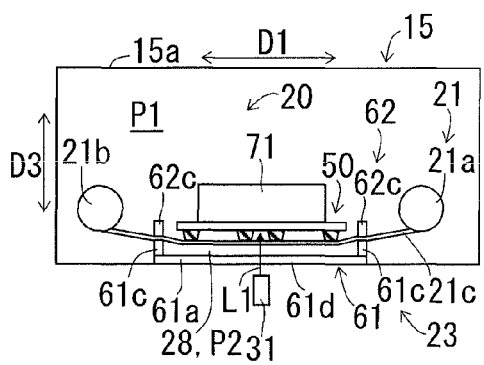

Next as shown in FIG. 14(d), a light irradiation step is executed to irradiate the intermediate product 50 with the light L1 through the principal plane 61a of the first sealing jig 61 and the lid member 21c while the lid member 21c is in close contact with the intermediate product 50. The irradiation uses the light irradiator 31 disposed externally to the first sealing jig 61. The organic semiconductor layer 45 on the auxiliary electrode 43 can be removed by the execution of the irradiation. The light irradiator 31 may be placed under an atmospheric environment.

Figure 14E:
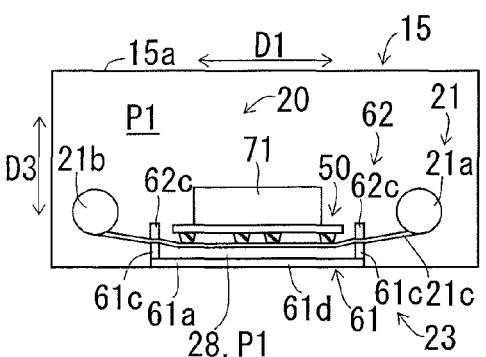
Figure 14F:
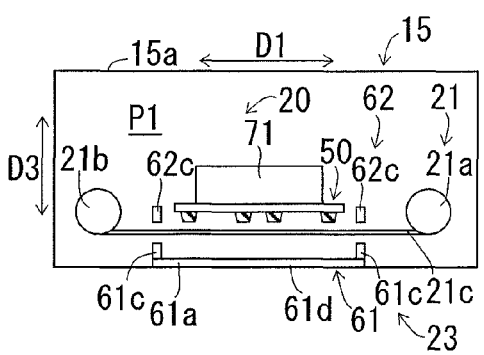

After the removal of the organic semiconductor layer 45, the gas inside the enclosed space 28 is released to reduce the internal pressure of the enclosed space 28, as shown in FIG. 14(e). For example, the internal pressure of the enclosed space 28 is lowered to the first pressure P1. The reduction in the internal pressure of the enclosed space 28 is followed by the step of separating the lid member 21c from the intermediate product 50, as shown in FIG. 14(f). In the separation step, if the gas inside the enclosed space 28 is still being released as shown in FIG. 14(e), an increase in the internal pressure of the chamber 15a during the execution of the separation step can be suppressed.

A Further Modification of the Intermediate Product Processing Device

The example where the light irradiator 31 is disposed externally to the first sealing jig 61, for example under an atmospheric environment, has been shown and described in the modification of the intermediate product processing device 15, shown in FIG. 12 to FIGS. 14(a)-14(f). In the modification shown in FIG. 12 to FIGS. 14(a)-14(f), if the light irradiator 31 is disposed under an atmospheric environment, then while the preparatory step and the enclosed-space forming step are underway, the differential pressure between the first pressure P1 and the atmospheric pressure is applied to the light-transmitting region 61d of the first sealing jig 61. This means that a differential pressure of up to about 1 atmosphere is likely to be applied to the light-transmitting region 61d. Accordingly, the light-transmitting region 61d needs configuring to be able to withstand the differential pressure of up to about 1 atmosphere. For example, if the light-transmitting region 61d is constructed of quartz, this quartz is to have a thickness of several centimeters in order for the light-transmitting region 61d to withstand the differential pressure of up to about 1 atmosphere.

In addition to a light source that generates such light as laser light, the light irradiator 31 usually includes imaging optics for reduced (or reduction) projection of the light on the intermediate product 50, converging optics for converging the laser light, and other optics. On the other hand, if the light-transmitting region 61d exists between the light irradiator 31 and the intermediate product 50, the so-called work distance, which is a distance from an exit plane of the optics to the intermediate product 50, needs to be at least the same as the thickness of the light-transmitting region 61d. If the thickness of the light-transmitting region 61d is large, therefore, the work distance needs to be correspondingly long, which reduces design flexibility of the optics. The large thickness of the light-transmitting region 61d also increases a cost of the first sealing jig 61.

With these drawbacks in mind, in a modification shown in FIGS. 15(a) to 15(f), the present inventors propose using an open-and-close controllable window 61e to configure a section of the principal plane 61a of the first sealing jig 61 so that the light from the light irradiator 31 passes the section of the principal plane 61a. In this case, when the light irradiator 31 is used to irradiate the intermediate product 50 with the light, the work distance can be reduced since the optics of the light irradiator 31 can be placed at an opening formed by opening the open-and-close controllable window 61e. Desired optics can be easily obtained as a result.

In the present modification, as shown in FIG. 15(a), the pressure application part 23 of the sealing mechanism 20 further includes an auxiliary chamber 72 configured to communicate with the internal space of the first sealing jig 61 when the open-and-close controllable window 61e is open. The light irradiator 31 is placed within the auxiliary chamber 72. As described later herein, when the first sealing jig 61 is out of contact with the lid member 21c, the open-and-close controllable window 61e of the first sealing jig 61 is closed. At the same time, however, when the light irradiator 31 irradiates the intermediate product 50 with light, the open-and-close controllable window 61e of the first sealing jig 61 is opened and the internal space of the first sealing jig 61 and that of the auxiliary chamber 72 are controlled to the second pressure P2 higher than the first pressure P1.

The method of removing the organic semiconductor layer 45 on the auxiliary electrode 43 using the intermediate product processing device 15 according to the present modification will be described in detail below with reference to of FIGS. 15(a) to 15(f).

First as shown in FIG. 15(a), the preparatory step is executed to oppose the intermediate product 50 and the first surface 21d of the lid member 21c. In this step, the open-and-close controllable window 61e of the first sealing jig 61 is closed in advance. In addition, the pressure in the internal space of the auxiliary chamber 72 is controlled to the second pressure P2. The second pressure P2 is set to a level at which the light irradiator 31 can operate, and this level is 1 atmosphere, for example. The auxiliary chamber 72 preferably has an internal environment free from oxygen and hydrogen. For example, the auxiliary chamber 72 is precharged with an inert gas such as nitrogen. Thus when the open-and-close controllable window 61e is opened and the gas with which the auxiliary chamber 72 is precharged comes into contact with the lid member 21c, oxygen and hydrogen can be prevented from penetrating through the lid member 21c and reaching the intermediate product 50.

Next as shown in FIG. 15(b), the enclosed-space forming step is executed to bring the first sealing jig 61 into contact with the second surface 21e of the lid member 21c under the environment controlled to the first pressure P1, and with the open-and-close controllable window 61e of the first sealing jig 61 remaining closed. The pressure in the enclosed space 28 formed between the first sealing jig 61 and the lid member 21c equals the first pressure since the open-and-close controllable window 61e remains closed.

After the above step, the intermediate product 50 is brought into contact with the first surface 21d of the lid member 21c, as shown in FIG. 15(c). Additionally the open-and-close controllable window 61e of the first sealing jig 61 is opened. Thus the internal space of the first sealing jig 61 and that of the auxiliary chamber 72 work together as the enclosed space 28 controlled to the second pressure P2 higher than the first pressure P1. Consequentially, the first surface 21d of the lid member 21c can be brought into strong and close contact with the intermediate product 50.

Next as shown in FIG. 15(d), the light irradiation step is executed to emit light toward the intermediate product 50 with the light irradiator 31 having its optics disposed at the opening formed by opening the open-and-close controllable window 61e. After the light irradiation step, the open-and-close controllable window 61e of the first sealing jig 61 is closed as shown in FIG. 15(e). After the open-and-close controllable window 61e has been closed, the internal pressure of the enclosed space 28 may be reduced to, for example, the first pressure P1 by releasing the internal gas from the enclosed space 28 in the first sealing jig 61. Then, the step of separating the lid member 21c from the intermediate product 50 follows as shown in FIG. 15(f).

A Further Modification of the Intermediate Product Processing Device

In the modification of the intermediate product processing device 15, shown in FIGS. 15(a) to 15(f), the pressure in a space surrounding the light irradiator 31 is applied to the second surface 21e of the lid member 21c when the open-and-close controllable window 61e of the first sealing jig 61 is open. Incidentally, it suffices if the pressure upon the second surface 21e of the lid member 21c is of such a level that allows the lid member 21c to be brought into close contact with the intermediate product 50. Meanwhile the pressure in the space surrounding the light irradiator 31 is commonly determined according to particular characteristics and specifications of the light irradiator 31, and set to be 1 atmosphere, for example. As in the modification shown in FIGS. 15(a) to 15(f), therefore, in the case that the space bordering the second surface 21e of the lid member 21c communicates with the space surrounding the light irradiator 31, the pressure applied to the second surface 21e of the lid member 21c may be of an excessive level exceeding the pressure needed to bring the lid member 21c into close contact with the intermediate product 50.

With this drawback in mind, in a modification shown in FIGS. 16(a) to 16(f), the present inventors propose a configuration that enables thickness of the principal plane 61a of the first sealing jig 61 to be reduced while concurrently enabling the internal pressure of the space contiguous to the second surface 21e of the lid member 21c to be controlled independently of the pressure in the space surrounding the light irradiator 31.

In the present modification, the principal plane 61a of the first sealing jig 61 includes the section through which the light from the light irradiator 31 passes, and this section is the light-transmitting region 61d constructed of a material, such as quartz having a light-transmitting property. In addition, the pressure application part 23 of the sealing mechanism 20 further includes a third sealing jig 63 disposed adjacently to the light-transmitting region 61d of the first sealing jig 61 and provided with an open-and-close controllable window 63e. As will be described in detail later, when the pressure in the internal space of the first sealing jig 61 is lower than the second pressure P2, an outer enclosed space 64 is formed in an internal space of the third sealing jig 63. The outer enclosed space 64 is blocked from atmospheric air by closing the open-and-close controllable window 63e, and is contiguous to the light-transmitting region 61d of the first sealing jig 61. The light irradiator 31 is disposed externally to the outer enclosed space 64. In the meantime, the open-and-close controllable window 63e of the third sealing jig 63 is opened when the light irradiator 31 irradiates the intermediate product 50 with light.

The method of removing the organic semiconductor layer 45 on the auxiliary electrode 43 using the intermediate product processing device 15 according to the present modification will be described in detail below with reference to FIGS. 16(a) to 16(f).

Figure 16A:
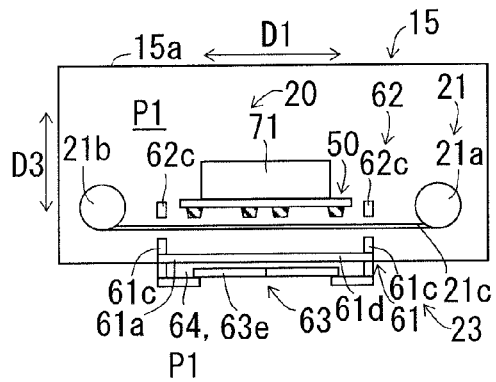
FIGS. 16(a) to 16(f) show various steps including the step of removing an organic semiconductor layer on an auxiliary electrode by use of the intermediate product processing device in a further modification thereof.

First as shown in FIG. 16(a), the preparatory step is executed to oppose the intermediate product 50 and the first surface 21d of the lid member 21c. In this step, the open-and-close controllable window 63e of the third sealing jig 63 is closed in advance. Accordingly, the outer enclosed space 64 blocked from the atmospheric air is formed inside the third sealing jig 63. As long as the differential pressure upon the light-transmitting region 61d is low and thus the thickness of the light-transmitting region 61d can be reduced, the outer enclosed space 64 is not limited in pressure. For example, although this is not shown, the outer enclosed space 64 can have its internal pressure controlled to the first pressure P1, the same pressure as in the internal space of the first sealing jig 61, by interconnecting the first sealing jig 61 and the third sealing jig 63 via a communicating line provided with an open/close valve, and opening the open/close valve of the communicating line.

Next as shown in FIG. 16(*b*), the enclosed-space forming step is executed to bring the first sealing jig 61 into contact with the second surface 21*e* of the lid member 21*c* while the open-and-close controllable window 63*e* of the third sealing jig 63 remains closed. After this step, the internal pressure of the enclosed space 28 formed between the first sealing jig 61 and the lid member 21*c* is raised to the second pressure P2 higher than the first pressure P1. In addition, the intermediate product 50 is brought into contact with the first surface 21*d* of the lid member 21*c*. This allows the first surface 21*d* of the lid member 21*c* to be brought into strong and close contact with the intermediate product 50. Here, in the case that the internal space of the first sealing jig 61 and that of the outer enclosed space 64 communicate via the communicating line, the internal pressure of the outer enclosed space 64 equals the second pressure P2, as with the internal pressure of the enclosed space 28.

Next, the open/close valve for the communicating line interconnecting the first sealing jig 61 and the outer enclosed space 64 is closed. In addition, as shown in FIG. 16(*c*), the open-and-close controllable window 63*e* of the third sealing jig 63 is opened. Thus the pressure in the internal space of the third sealing jig 63 is controlled to a third pressure P3, the same pressure as that surrounding the light irradiator 31. The third pressure P3 is, for example, atmospheric pressure. At this time, the internal pressure of the enclosed space 28 is equal to the second pressure P2 higher than the first pressure P1, as described above.

Next as shown in FIG. 16(*d*), while the lid member 21*c* is in firm contact with the intermediate product 50, the light irradiation step is executed to irradiate the intermediate product 50 with light L1 through the principal plane 61*a* of the first sealing jig 61 and the lid member 21*c*. After that, as shown in FIG. 16(*e*), the open-and-close controllable window 63*e* of the third sealing jig 63 is closed. After the closing of the open-and-close controllable window 63*e*, the internal pressure of the enclosed space 28 may be reduced to, for example, the first pressure P1 by releasing the internal gas from the enclosed space 28. Similarly, the internal pressure of the outer enclosed space 64 may be reduced to, for example, the first pressure P1 by releasing the internal gas from the outer enclosed space 64. In this case, the open/close valve for the communicating line interconnecting the first sealing jig 61 and the outer enclosed space 64 may be opened to simultaneously execute the release of the internal gas from the outer enclosed space 64 and the release of the internal gas from the first sealing jig 61. Then, the step of separating the lid member 21*c* from the intermediate product 50 follows as shown in FIG. 16(*f*).

According to the present modification, since the third sealing jig 63 with the open-and-close controllable window 63*e* is disposed adjacently to the light-transmitting region 61*d* of the first sealing jig 61, the outer enclosed space 64 blocked from the atmospheric air can be formed in an outer space of the outer enclosed space 64 that is contiguous to the light-transmitting region 61*d* of the first sealing jig 61 in at least one of the preparatory step, the enclosed-space forming step, and the close-fitting step. Accordingly, the pressure externally applied to the light-transmitting region 61*d* when the internal pressure of the enclosed space 28 is equal to the first pressure P1 can be limited to a pressure level below atmospheric pressure. For example, when the communicating line interconnecting the first sealing jig 61 and the outer enclosed space 64 is disposed as described above, the differential pressure applied to the light-transmitting region 61*d* in at least one of the preparatory step, the enclosed-space forming step, and the close-fitting step, can be limited to nearly zero. For this reason, the differential pressure applied to the light-transmitting region 61*d* will be maximized when the open-and-close controllable window 63*e* of the third sealing jig 63 is opened and atmospheric pressure is applied from the outside to the light-transmitting region 61*d*. Here, as in the present modification, if the internal pressure of the enclosed space 28 is increased to the second pressure P2 and then the open-and-close controllable window 63*e* of the third sealing jig 63 is opened, a maximum value of the differential pressure applied to the light-transmitting region 61*d* will be the difference between atmospheric pressure and the second pressure P2. In the present modification, therefore, appropriate control of the second pressure P2 allows suppression of an excessive increase in the differential pressure upon the light-transmitting region 61*d*. This will in turn allow the light-transmitting region 61*d* to be formed from thin quartz or the like, and thus optics to be designed with high flexibility and a significant increase in the cost of the first sealing jig 61 to be suppressed.

In addition, since the space bordering the second surface 21*e* of the lid member 21*c* and the space surrounding the light irradiator 31 do not communicate, the second pressure P2 for firmly fitting the lid member 21*c* to the intermediate product 50 can be prevented from increasing too much.

The examples where the lid member 21*c* is brought into close contact with the intermediate product 50 from below have been shown and described in the modifications shown in FIG. 12 to FIGS. 16(*a*)-16(*f*). These examples, however, do not limit the direction in which the lid member 21*c* is brought into close contact with the intermediate product 50. For example, in the above modifications shown in FIG. 12 to FIGS. 16(*a*)-16(*f*) as well, the lid member 21*c* may be brought into close contact with the intermediate product 50 from above, as in the modifications shown in FIG. 1 to FIGS. 5(*a*)-5(*d*). Alternatively, although this is not shown, the lid member 21*c* may be brought into close contact with the intermediate product 50 from a lateral direction.

Bringing the lid member 21*c* into close contact with the intermediate product 50 from above means that the substrate retaining jig 71 can be placed below the intermediate product 50 and that the intermediate product 50 can be supported from below using the substrate retaining jig 71. In this case, the substrate 41 of the intermediate product 50 can be prevented from suffering bending due to gravity. In consideration of the fact that interference in position is prone to occur between the lid member 21*c* and the substrate retaining jig 71, it is very effective that the substrate 41 can be stably supported from below at the side where the lid member 21*c* is absent. Preventing the bending of the substrate 41, in turn, leads to enhancing accuracy of the process performed while the lid member 21*c* is in close contact with the intermediate product 50. For example, the light L1 can be emitted toward the intermediate product 50 while the lid member 21*c* is in close contact with the intermediate product 50, which removes the organic semiconductor layer 45 on the auxiliary electrode 43 with high positional accuracy.

Meanwhile, when the above-described first electrodes 42, auxiliary electrodes 43, organic semiconductor layers 45, and second electrode 46 are formed using vapor deposition, sputtering, or some other film-forming method that involves projecting particles and/or molecules of their raw materials, it is preferable that all surfaces of the substrate 41, at least the surface where the first electrodes 42 and the like are formed should face downward during film formation to prevent these elements from becoming contaminated with impurities. This is because the fact that of all the surfaces of the substrate 41, at least the surface where the first electrodes 42 and the like are to be formed faces downward is are contributes to preventing gravitationally falling impurities from entering the first electrodes 42 and the like. In the following description, of all surfaces of the substrate 41, at least the surface where the first electrodes 42 and the like are to be formed may also be termed the element forming surface 41*a*.

To enhance the accuracy of the process performed while the lid member 21*c* is in close contact with the intermediate product 50, it is preferable that the element forming surface 41*a* be directed upward as described above. To prevent the entry of impurities into the first electrodes 42 and the like, on the other hand, it is preferable that the element forming surface 41*a* be directed downward as described above. An element manufacturing apparatus 10 capable of satisfying both of the two requirements will be described below per FIG. 17.

A Modification of the Element Manufacturing Apparatus

Figure 17:
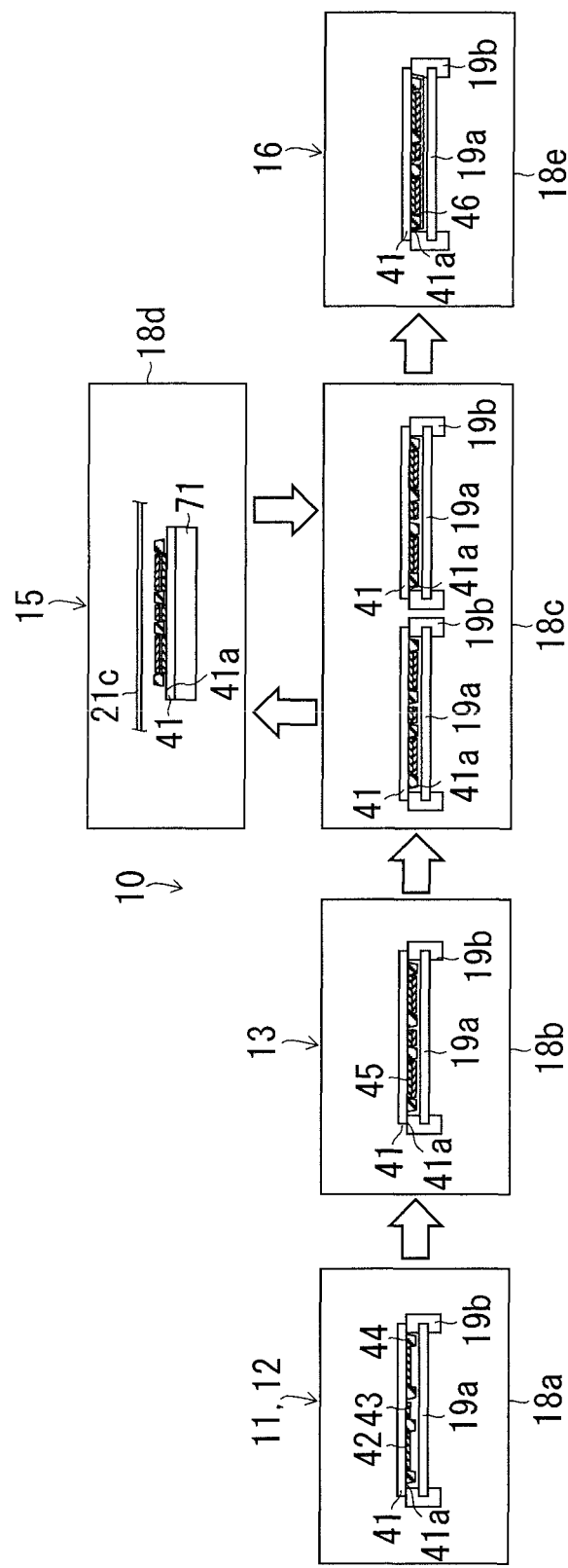
FIG. 17 is a diagram showing a modification of the element manufacturing apparatus.

FIG. 17 is a diagram showing schematically the element manufacturing apparatus 10 according to a modification. The element manufacturing apparatus 10 according to the present modification includes: a first film-forming chamber 18*a* that forms a first electrode 42 and an auxiliary electrode 43 on the element forming surface 41*a* of a substrate 41; a second film-forming chamber 18*b* that forms an organic semiconductor layer 45 on the element forming surface 41*a* of the substrate 41; an inversion chamber 18*c*; a process chamber 18*d* that performs a predetermined process with a lid member 21*c* placed in firm contact with the element forming surface 41*a* of the substrate 41; and a third film-forming chamber 18*e* that forms a second electrode 46 on the element forming surface 41*a* of the substrate 41. It can be said that: the first film-forming chamber 18*a* functions as the first electrode forming device 11 and auxiliary electrode forming device 12; the second film-forming chamber 18*b* functions as the organic semiconductor layer forming device 14; the process chamber 18*d* functions as the intermediate product processing device 15; and the third film-forming chamber 18*e* functions as the second electrode forming device 16.

The chambers 18*a* to 18*e* are maintained under a vacuum environment. For example, internal pressures of the chambers 18*a* to 18*e* are set to be a maximum of $1 \times 10^4$ Pa, or preferably a maximum of $1 \times 10^2$ Pa, or further preferably a maximum of $1 \times 10^{-1}$ Pa. Transfer of the substrate 41 between the chambers 18*a* to 18*e* is also performed under the vacuum environment. For example, although this is not shown, in the 18*a* to 18*e* chamber arrangement a transfer chamber maintained under the vacuum environment is disposed between chambers, and a robot arm provided in each of the transfer chambers transfers the substrate 41. With this apparatus configuration, necessity for execution of an air supply or release operation around the substrate 41 with each transfer thereof between the chambers 18*a* to 18*e* can be eliminated or alleviated, which in turn allows manufacturing efficiency of organic semiconductor elements 40 to be enhanced. In addition, entry of impurities during the manufacture of the organic semiconductor elements 40 can be suppressed and quality and reliability of the organic semiconductor elements 40 obtained can also be enhanced.

The following describes a method of manufacturing an organic semiconductor element 40 using the element manufacturing apparatus 10 shown in FIG. 17.

In the first film-forming chamber 18*a*, the first electrode 42 and the auxiliary electrode 43 are formed on the element forming surface 41*a* of the substrate 41 that is directed downward. A way to retain the substrate 41 with the element forming surface 41*a* directed downward is not limited and various methods are useable. For example, as shown in FIG. 17, a vapor deposition process using a mask 19*a* can be performed in the first film-forming chamber 18*a*. In this case, the substrate 41 with the element forming surface 41*a* directed downward is retained by resting the substrate 41 on a mask frame 19*b* for mounting the mask 19*a* in a tensioned condition across the mask frame 19*b*.

In the second film-forming chamber 18*b*, as in the first film-forming chamber 18*a*, the organic semiconductor layer 45 is formed on the element forming surface 41*a* of the substrate 41 that is directed downward. A mask 19*a* and mask frame 19*b* used in the second film-forming chamber 18*b* may be the same as or different from those used in the first film-forming chamber 18*a*.

After the organic semiconductor layer 45 has been formed on the element forming surface 41*a*, the substrate 41 is loaded into the inversion chamber 18*c* with the element forming surface 41*a* facing downward. Next after the substrate 41 has been turned upside down in the inversion chamber 18*c*, the element forming surface 41*a* is directed upward and the substrate 41 is loaded into the process chamber 18*d*. In the process chamber 18*d*, the substrate 41 is pressed against the substrate 41 from above with the element forming surface 41*a* facing upward. This operation is followed by the execution of the above processes such as the partial removal of the organic semiconductor layer 45 on a protrusion 44 by light irradiation. After undergoing the processes, the substrate 41 is once again loaded into the inversion chamber 18*c*, but this time, with the element forming surface 41*a* facing upward. Next after being turned back upside down in the inversion chamber 18*c*, the substrate 41 is loaded into the third film-forming chamber 18*e* with the element forming surface 41*a* facing downward.

In the third film-forming chamber 18*e*, as in the first film-forming chamber 18*a* or the film-forming chamber 18*b*, the second electrode 46 is formed on the element forming surface 41*a* of the substrate 41 that is directed downward. A mask 19*a* and mask frame 19*b* used in the third film-forming chamber 18*e* may be the same as or different from those used in the first film-forming chamber 18*a* or the second film-forming chamber 18*b*.

According to the present modification, the steps executed by the above-described first electrode forming device 11, auxiliary electrode forming device 12, organic semiconductor layer forming device 14, intermediate product processing device 15, and second electrode forming device 16, can be executed in the series of chambers 18*a* to 18*e* maintained under the vacuum environment. Accordingly the manufacturing efficiency of the organic semiconductor element 40 can be enhanced, and thus the quality and reliability of the organic semiconductor element 40 obtained can be enhanced. In addition, the film-forming process performed by the first electrode forming device 11, the auxiliary electrode forming device 12, the organic semiconductor layer forming device 14, and the second electrode forming device 16, can be executed with the element forming surface 41*a* of the substrate 41 facing downward. Accordingly the entry of impurities into the electrodes and layer formed can be suppressed. Furthermore, the process performed by the above-described intermediate product processing device 15 can be executed with the element forming surface 41a of the substrate 41 facing upward. The substrate 41 of the intermediate product 50 can therefore be prevented from suffering bending due to gravity, and thus, accuracy of the process executed while the lid member 21c is in close contact with the intermediate product 50 can be enhanced.

Although not shown in the present modification, the process by the above-described protrusion forming device 13, that is, the step of forming protrusions 44 on the element forming surface 41a of the substrate 41, is not limited in terms of execution timing and location. For example, protrusions 44 may be formed in advance upon the substrate 41 loaded into the first film-forming chamber 18a, or after the first electrode 42 and the auxiliary electrode 43 have been formed on the element forming surface 41a, protrusions 44 may be formed on the element forming surface 41a before the organic semiconductor layer 45 is formed on the element forming surface 41a.

In addition, the example in which the inversion chamber 18c is introduced into the element manufacturing apparatus 10 when the intermediate product processing device 15 is configured as a device to remove the organic semiconductor layer 45, has been shown and described in the present modification. This example, however, does not limit applicability of the present invention. As described above, the introduction of the inversion chamber 18c into the element manufacturing apparatus 10 may also take place when the intermediate product processing device 15 is configured as an exposure device or a vapor deposition device.

A Further Modification of the Intermediate Product Processing Device

An example in which a third sealing jig 63 is disposed as in the modification shown in FIGS. 16(a) to 16(f) and a lid member 21c is brought into close contact with a substrate 41 having an element forming surface 41a facing upward as in the modification shown in FIG. 17, is described below as a further modification of the intermediate product processing device 15, with reference to FIGS. 18(a) to 18(h). In the present modification, the same elements as those of the modification shown in FIGS. 16(a) to 16(f) are each assigned the same reference number and detailed description of these elements is omitted.

Figure 18A:
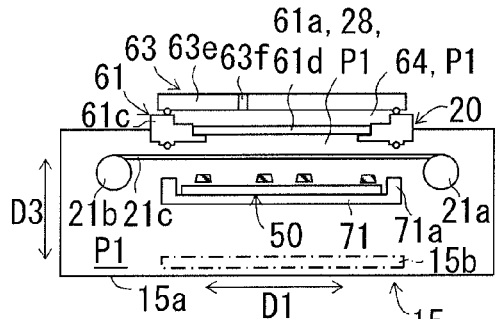
FIGS. 18(a) to 18(h) show various steps including the step of removing an organic semiconductor layer on an auxiliary electrode by use of the intermediate product processing device in a further modification thereof.

In the present modification, as shown in FIG. 18(a), the substrate 41, part of an intermediate product 50, is supported from below by a substrate retaining jig 71 with the element forming surface 41a facing upward. The lid member 21c, a first sealing jig 61, and the third sealing jig 63 are positioned above the intermediate product 50.

Figure 15:
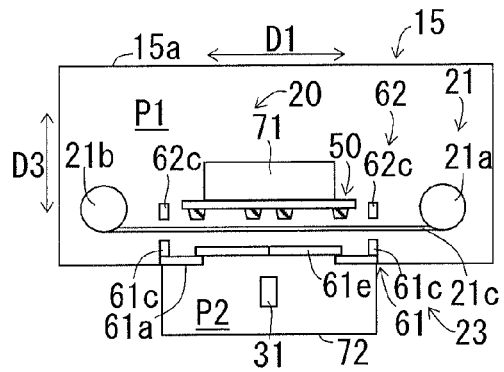
FIGS. 15(a) to 15(f) show various steps including the step of removing an organic semiconductor layer on an auxiliary electrode by use of the intermediate product processing device in a further modification thereof.
Figure 15:
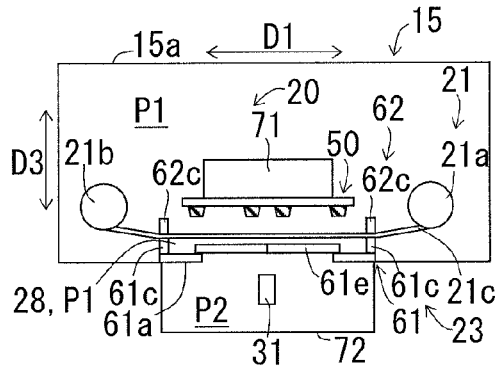
Figure 15:
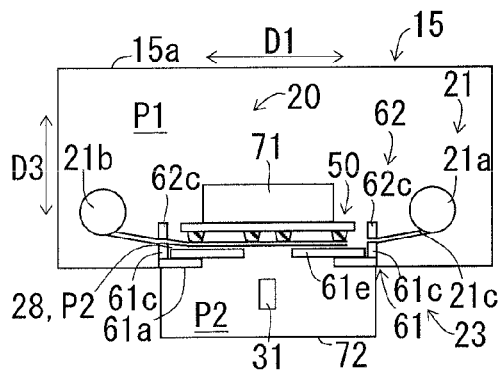
Figure 15:
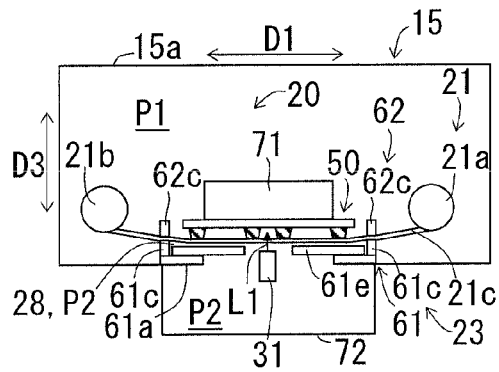
Figure 15:
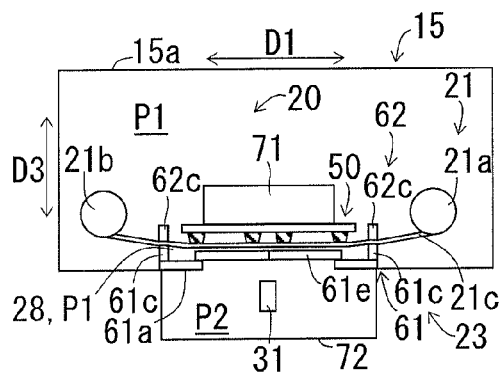
Figure 15:
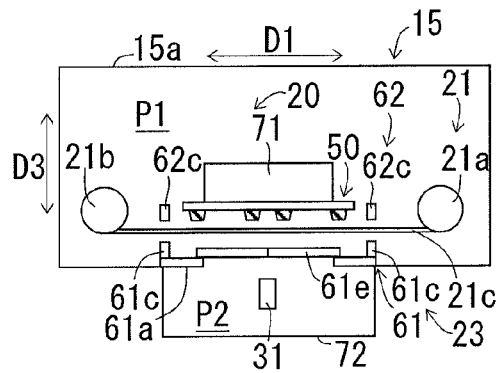

As shown in FIG. 18(a), the substrate 41 of the intermediate product 50 may include lateral edges 71a protruding toward the first sealing jig 61, near a lateral region of the intermediate product 50. The lateral edges 71a each work with a first side surface 61b of the first sealing jig 61 to securely hold the lid member 21c from both sides when an enclosed space 28 is formed. That is to say, in the present modification, the second sealing jig 62 in each of FIGS. 14, 15, and 16 can be described as being formed integrally with the substrate retaining jig 71. When the second sealing jig 62 is formed integrally with the substrate retaining jig 71, even if a gas inside the enclosed space 28 penetrates through the lid member 21c and reaches a first surface 21d of the lid member 21c, such a gas will be trapped in a space bounded by the first side surface 61b of the first sealing jig 61 and the lid member 21c. This will prevent an internal space of a chamber 15a from degrading in a degree of vacuum. In the example of FIG. 14, 15, or 16 as well, the second sealing jig 62 and the substrate retaining jig 71 may be formed integrally.

Height of the lateral edges 71a preferably is much the same as that of the intermediate product 50 retained by the substrate retaining jig 71. In this case, the first surface 21d of the lid member 21c comes into contact with upper surfaces of the lateral edges 71a, and likewise comes into contact with an upper surface of the intermediate product 50. This enables the first surface 21d of the lid member 21c to be easily brought into close contact with the intermediate product 50 in the vapor deposition step described later.

In addition as shown in FIG. 18(a), a light-transmitting region 63f formed from a material having a light-transmitting property may exist in an open-and-close controllable window 63e of the third sealing jig 63. As will be described in detail later, the light-transmitting region 63f is useable for adjusting a position of the intermediate product 50 as viewed externally from the third sealing jig 63. In the example of FIG. 16 as well, the light-transmitting region 63f may be formed in the open-and-close controllable window 63e of the third sealing jig 63.

A method of removing the organic semiconductor layer 45 on the auxiliary electrode 43 using the intermediate product processing device 15 according to the present modification will be described below with reference to FIGS. 18(a) to 18(h).

First as shown in FIG. 18(a), the intermediate product 50 is loaded into the chamber 15a of the intermediate product processing device 15 with the element forming surface 41a of the substrate 41 facing upward. The intermediate product 50 is loaded via a substrate removal window 15b shown with a dashed line in FIG. 18(a). Although this is not shown, the substrate retaining jig 71 may include receiving pins configured to be able to move vertically to receive the intermediate product 50.

The substrate removal window 15b preferably extends along a first direction D1 in which the lid member 21c is transported. The direction in which the intermediate product 50 moves during loading via the substrate removal window 15b is a direction crossing the first direction D1 in which the lid member 21c is transported, for example a direction orthogonal to D1. In any one of the above embodiment and modifications as well, the direction in which the intermediate product 50 moves during loading via the substrate removal window 15b may cross the direction in which the lid member 21c is transported, or more specifically, both directions may be orthogonal.

In addition, as shown in FIG. 18(a), the preparatory step for opposing the intermediate product 50 and the first surface 21d of the lid member 21c is executed, whereby the intermediate product 50 becomes at least partly covered with the first surface 21d of the lid member 21c. In this application, the "covered" state means a state in which, when viewed in a normal direction of the substrate 41 of the intermediate product 50, the lid member 21c at least partly overlaps the intermediate product 50; it is irrespective of whether the lid member 21c and the intermediate product 50 abut upon each other.

Figure 16B:
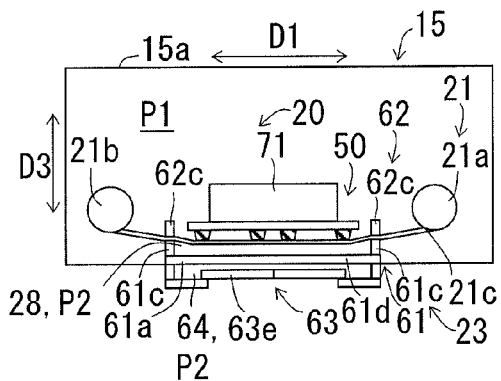
Figure 16C:
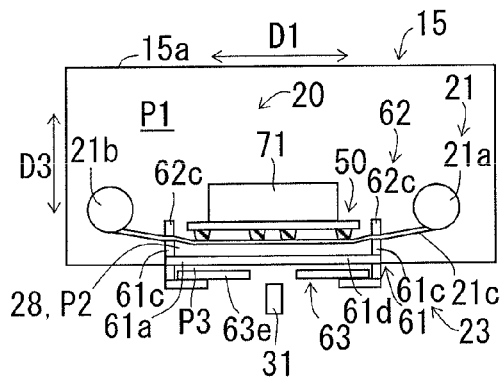
Figure 16D:
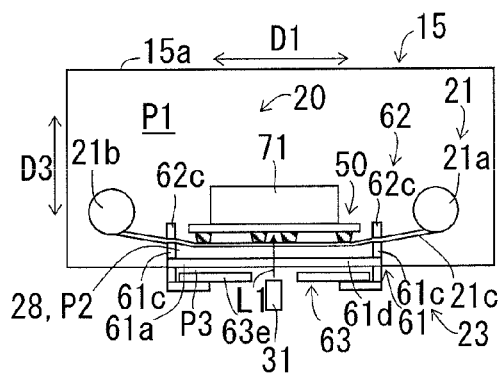
Figure 16E:
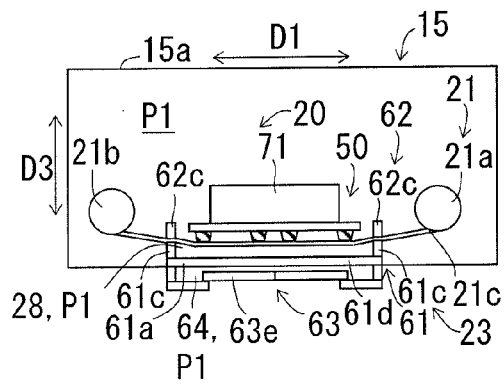
Figure 16F:
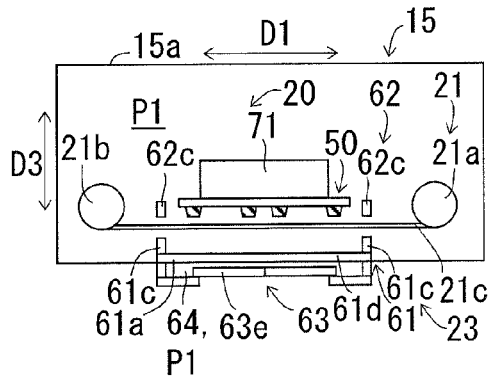
Figure 18B:
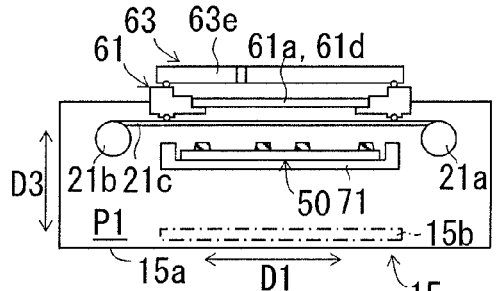

Next as shown in FIG. 18(b), the second surface 21e of the lid member 21c is brought into contact with the first sealing jig 61 by moving the lid member 21c toward the first sealing jig 61, that is, upward. While FIG. 16(b) shows the example of moving the unwinder 21a and the take-up section 21b upward along with the lid member 21c, this example is for illustrative purposes only and although this is not shown, a section of the lid member 21c that faces the intermediate product 50 may be moved upward by moving upward a guide roll or the like that is in contact with the lid member 21c on the side of the first surface 21d. Such a mechanism for moving the lid member 21c may also be disposed in any one of the above embodiment and modifications.

Figure 18C:
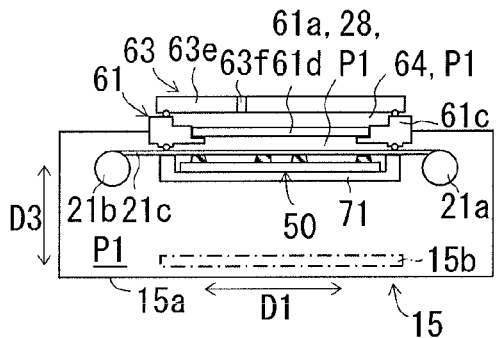

Next as shown in FIG. 18(c), the substrate retaining jig 71 is moved upward to make each of its lateral edges 71a work with a second side surface 61c of the first sealing jig 61 to securely hold the lid member 21c from both sides. Thus, the enclosed space 28 hermetically sealed from surroundings is formed in the space bounded by a second surface 21e of the lid member 21c and the first sealing jig 61. The internal pressure of the enclosed space 28 at this time equals the first pressure P1, as with the internal pressure of the chamber 15a.

A camera may be placed externally to the third sealing jig 63, and before the lid member 21c is sandwiched between the first sealing jig 61 and the substrate retaining jig 71, the position of the intermediate product 50 may be adjusted while observing this position via the light-transmitting region 63f of the third sealing jig 63 through the camera. For example, the intermediate product 50 may be position-matched to a light irradiator 31 used to emit light toward the intermediate product 50. To ensure that such a position adjustment can be performed more accurately, the substrate retaining jig 71 may be configured so that it can be moved in the first direction D1 or a second direction D2. The substrate retaining jig 71 may also be configured so that it can be rotated in a plane parallel to the first direction D1 and the second direction D2. Such a driving mechanism for the substrate retaining jig 71 may also be disposed in the above modifications shown in FIGS. 14, 15 and 16.

Then, as in the modification shown in FIG. 16(b), the internal pressure of the enclosed space 28 is raised to the second pressure P2 higher than the first pressure P1. This allows the first surface 21d of the lid member 21c to be brought into strong and close contact with the intermediate product 50. The gas introduced into the enclosed space 28 at this time is a moisture-free inert gas, preferably nitrogen, in particular. Thus, a time needed to later release this internal gas from the enclosed space 28 for reduced internal pressure can be shortened.

Figure 18D:
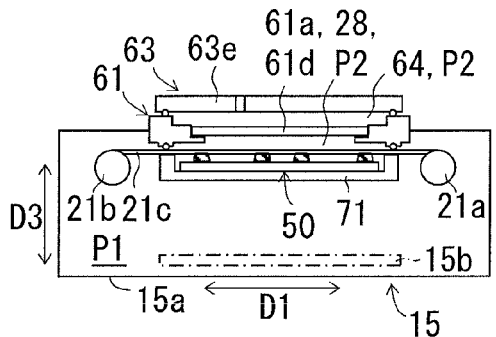

In addition, an internal pressure of an outer enclosed space 64 formed in the outer space of the first sealing jig 61 that is contiguous to a light-transmitting region 61d of the first sealing jig 61 is raised to the second pressure P2, as in the modification shown in FIG. 16(b). In this manner, a state in which the internal pressure of the enclosed space 28 and that of the outer enclosed space 64 both become equal to the second pressure P2 is provided as shown in FIG. 18(d).

Gas intake/exhaust means connected to the enclosed space 28 may be the same as or different from that of the outer enclosed space 64. If the same gas intake/exhaust means is used, occurrence of a pressure gradient between the enclosed space 28 and the outer enclosed space 64 will be suppressed, which will in turn contribute to suppressing any gas leakage due to the pressure gradient. If different gas intake/exhaust means is used, since no communication is established between the enclosed space 28 and the outer enclosed space 64, the internal gas of the outer enclosed space 64 can be prevented from flowing into the enclosed space 28, so that the internal pressure of the enclosed space 28 can also be prevented from becoming an unintended or undesired value.

Gas intake/exhaust ports provided on the first sealing jig 61 and the third sealing jig 63 in order to introduce/release the gas into/from the enclosed space 28 and the outer enclosed space 64, preferably extend along the first direction D1 in which the lid member 21c is transported. Thus the gas intake/exhaust means connected to the gas intake/exhaust ports can be easily arranged without bringing the gas intake/exhaust means into interference with the lid member 21c. If the gas intake/exhaust means for the enclosed space 28 and that of the outer enclosed space 64 are arranged independently of each other, the gas intake/exhaust means for the enclosed space 28 will be preferably disposed at an opposite side with respect to the outer enclosed space 64.

Figure 18E:
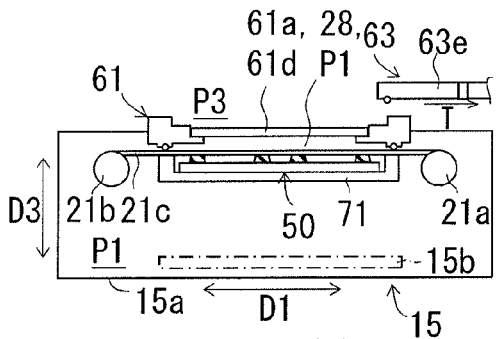

Next as shown in FIG. 18(e), the open-and-close controllable window 63e of the third sealing jig 63 is opened. Thus the pressure in the internal space of the third sealing jig 63 becomes a third pressure P3, the same pressure as that of the region around the light irradiator 31, for example, atmospheric pressure. The open-and-close controllable window 63e may be configured to slide open to one side, not both sides, as shown in FIG. 18(e).

Figure 18F:
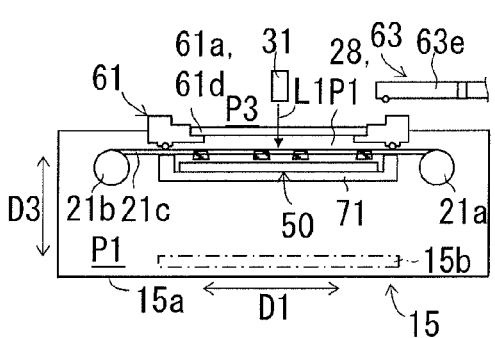
Figure 18G:
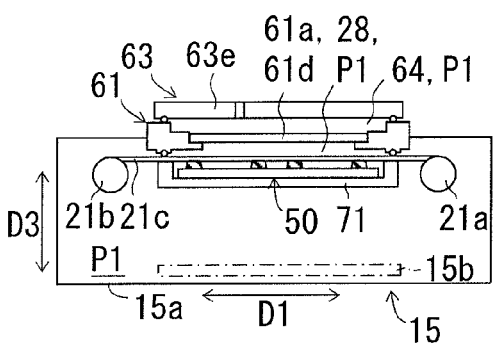

Next as shown in FIG. 18(f), while the lid member 21c is in firm contact with the intermediate product 50, a light irradiation step is executed to irradiate the intermediate product 50 with light L1 through the light-transmitting region 61d of the first sealing jig 61 and the lid member 21c. After that, as shown in FIG. 18(g), the open-and-close controllable window 63e of the third sealing jig 63 is closed. After the closing of the open-and-close controllable window 63e, the internal pressure of the enclosed space 28 may be reduced to, for example, the first pressure P1 by releasing the internal gas from the enclosed space 28. Similarly, the internal pressure of the outer enclosed space 64 may be reduced to, for example, the first pressure P1 by releasing the internal gas from the outer enclosed space 64. The degrees of vacuum provided in the enclosed space 28 and the outer enclosed space 64 may differ from each other. For example, exhaust may be performed so that the internal pressure of the enclosed space 28 is lower than that of the outer enclosed space 64. Since the outer enclosed space 64 is a space in which the pressure becomes atmospheric pressure when the open-and-close controllable window 63e is opened, a very long time is considered to be needed to provide in the outer enclosed space 64 the degree of vacuum that is substantially equal to that provided in the enclosed space 28. Therefore, if the degree of vacuum to be provided in the outer enclosed space 64 is set to be lower than the degree of vacuum to be provided in the enclosed space 28, this will enable reduction in the time required for the entire exhaust step.

Figure 18H:
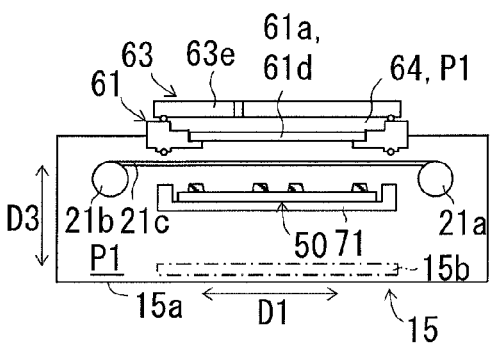

After the above, a separation step is executed to separate the lid member 21c from the intermediate product 50, as shown in FIG. 18(h). The step of moving the lid member 21c away from the first sealing jig 61 is also executed. After this step, at least a section of the lid member 21c that corresponds to length of the intermediate product 50 is delivered toward the take-up section 21b. This will enable a new lid member 21c to be brought into close contact with the intermediate product 50 next loaded into the chamber 15a.

According to the present modification, since the lid member 21c is supported from below by the substrate retaining jig 71, the substrate 41 can be prevented from suffering bending due to gravity. Thus, accuracy of the process executed while the lid member 21c is in close contact with the intermediate product 50 can be enhanced.

A Further Modification of the Intermediate Product Processing Device

In the above-described embodiment and modifications, the packings 25 and the first sealing jig 61 need to be pressed with a measure of force against the second surface 21e of the lid member 21c in order that the enclosed space 28 hermetically sealed from surroundings will be formed in a space contiguous to the second surface 21e of the lid member 21c. In this case, the second sealing jig 62 and the lateral edges 71a of the substrate retaining jig 71, for example, become necessary for holding securely the lid member 21c therebetween. This would increase the number of members to be arranged around the intermediate product 50 and thus complicate the arrangement of the members. In addition, the intermediate product 50 could suffer some form of damage due to the force for pressing the packings 25 and the first sealing jig 61 against the lid member 21c. In light of these factors, it is preferable that the hermetic sealing of the enclosed space 28 be provided in advance by use of a stable sealing method such as welding, bonding with an adhesive, or fixing with a jig, not that such sealing be provided by pressing the packings 25 and the first sealing jig 61 against the lid member 21c.

Using an irreversible method such as welding to fix the lid member 21c, on the other hand, would make it difficult to use a new lid member 21c for each intermediate product 50, which may result in impurities and the like building up on the lid member 21c. Since the lid member 21c is an element that needs to be brought into close contact with the intermediate product 50, it is considered that if the lid member 21c is contaminated, this will decrease the quality and reliability of the organic semiconductor element 40 obtained.

With these problems in mind, in a modification shown in FIGS. 19(a) to 19(h), the present inventors propose providing independently a member to be used to form an enclosed space 28, and a member to be brought into close contact with an intermediate product 50.

Figure 19:
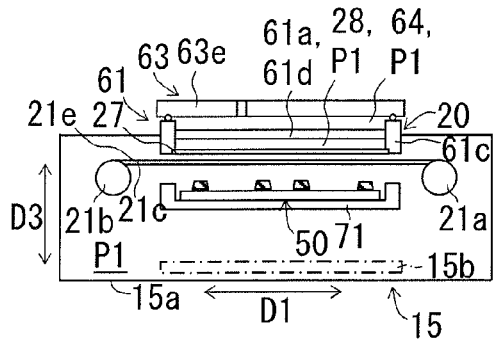
FIGS. 19(a) to 19(h) show various steps including the step of removing an organic semiconductor layer on an auxiliary electrode by use of the intermediate product processing device in a further modification thereof.
Figure 19:
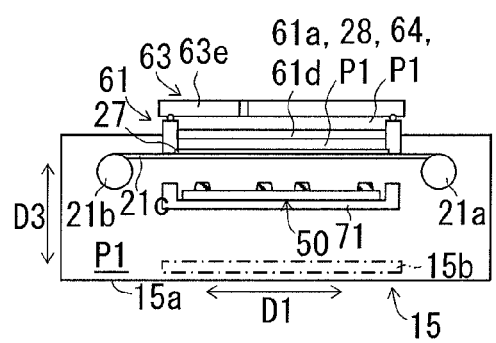
Figure 19:
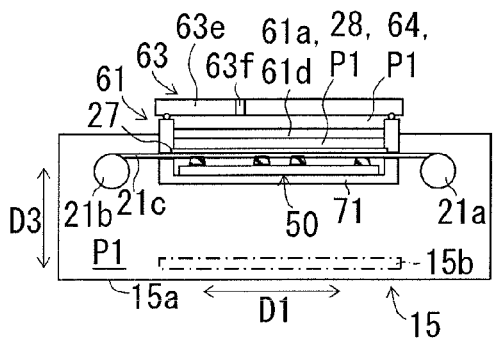
Figure 19:
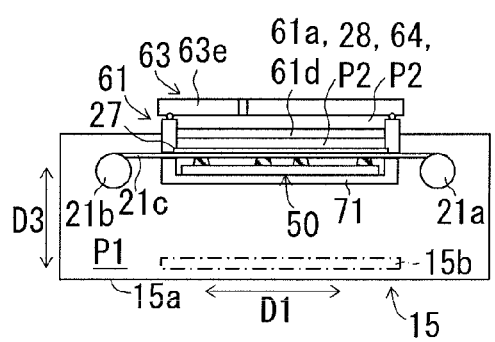
Figure 19:
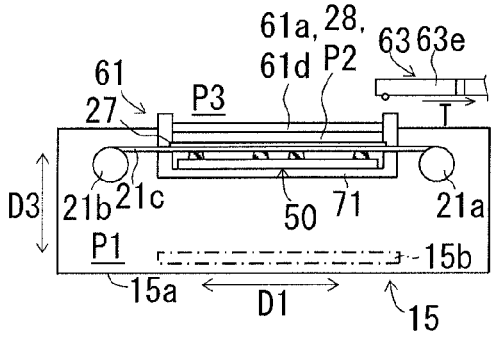
Figure 19:
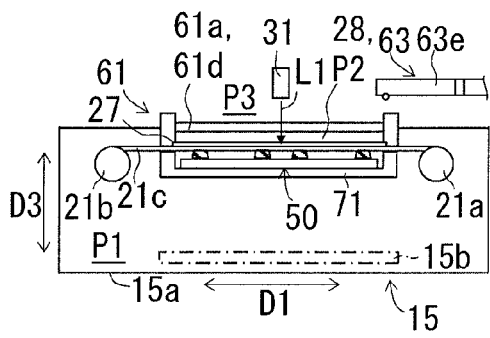
Figure 19:
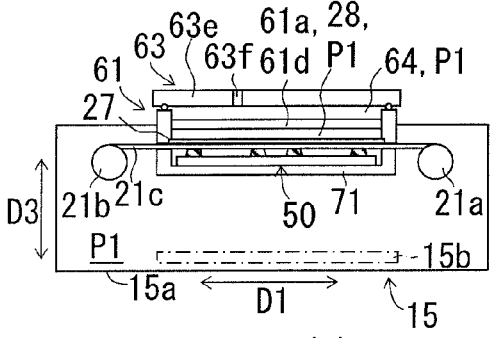
Figure 19:
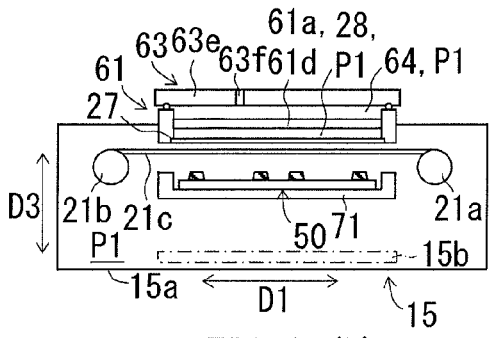

In the present modification, as shown in FIG. 19(a), the enclosed space 28 is formed in a space bounded by a film 27 that is disposed so as to face a second surface 21e of a lid member 21c, and a first sealing jig 61 to which the film 27 is fixed. In addition, the enclosed space 28 is formed at a side of the film 27 that is opposite to the lid member 21c. The film 27, as with the lid member 21c, is formed from a material having a light-transmitting property, such as glass or plastic. The film 27 is also formed to have such a level of flexibility that enables the enclosed space 28 to expand. In addition, the film 27 preferably has a predetermined gas-barrier property in terms of gastightness. For example, the film 27 preferably has a maximum oxygen transmission rate of 100 cc/m²·day, which is more preferably down to 30 cc/m²·day and further preferably down to 15 cc/m²·day. If the film 27 has such a gas-barrier property, there is no need for the lid member 21c to have a gas-barrier property. For example, if the maximum oxygen transmission rate of the film 27 is 100 cc/m²·day, the lid member 21c is permitted to exceed 100 cc/m²·day in oxygen transmission rate.

A method of removing a part of the organic semiconductor layer 45 on the auxiliary electrode 43 using the intermediate product processing device 15 according to the present modification will be described below with reference to FIGS. 19(a) to 19(h). In the present modification, the same elements as those of the modification shown in FIGS. 18(a) to 18(h) are each assigned the same reference number and detailed description of these elements is omitted.

First as shown in FIG. 19(a), the intermediate product 50 is loaded into the chamber 15a of the intermediate product processing device 15 with the element forming surface 41a of the substrate 41 facing upward. In addition, the intermediate product 50 is covered with the first surface 21d of the lid member 21c at a side where the protrusions 44 of the intermediate product 50 are provided, that is, at a side of the element forming surface 41a.

Next as shown in FIG. 19(b), the second surface 21e of the lid member 21c is brought into close proximity to or into contact with the film 27 by moving the lid member 21c toward the first sealing jig 61, that is, upward. After this, as shown in FIG. 19(c), the substrate retaining jig 71 is moved upward. This brings the first surface 21d of the lid member 21c into close proximity to or into contact with the intermediate product 50.

After that, as shown in FIG. 19(d), a gas is injected into the enclosed space 28. This enhances the internal pressure of the enclosed space 28 to the second pressure P2 higher than the first pressure P1 in the space between the lid member 21c and the intermediate product 50. The enclosed space 28 then expands, thus displacing the film 27 toward the lid member 21c, and causing the film 27 to apply a holding pressure to the lid member 21c. This brings the first surface 21d of the lid member 21c into strong and close contact with the intermediate product 50. In addition, the internal pressure of the outer enclosed space 64 rises to the second pressure P2.

Next as shown in FIG. 19(e), the open-and-close controllable window 63e of the third sealing jig 63 is opened, and then as shown in FIG. 19(f), the intermediate product 50 is irradiated with light L1 from the light irradiator 31. After the irradiation, as shown in FIG. 19(g), the open-and-close controllable window 63e of the third sealing jig 63 is closed. Next as shown in FIG. 19(h), the lid member 21c is separated from the intermediate product 50. The lid member 21c is also moved away from the first sealing jig 61. After the movement, at least a section of the lid member 21c that corresponds to length of the intermediate product 50 is delivered toward the take-up section 21b. This will enable a new lid member 21c to be brought into close contact with the intermediate product 50 next loaded into the chamber 15a.

According to the present modification, the enclosed space 28 is preformed by using the film 27 fixed to the first sealing jig 61. For this reason, it is unnecessary to press any member against the lid member 21c to form a new enclosed space 28. The number of members to be arranged around the intermediate product 50 can therefore be prevented from increasing, and hence, complex arrangement of the members can be prevented. In addition, the intermediate product 50 can be prevented from suffering some form of damage due to a force needed to press a member against the lid member 21c.

Figure 20:
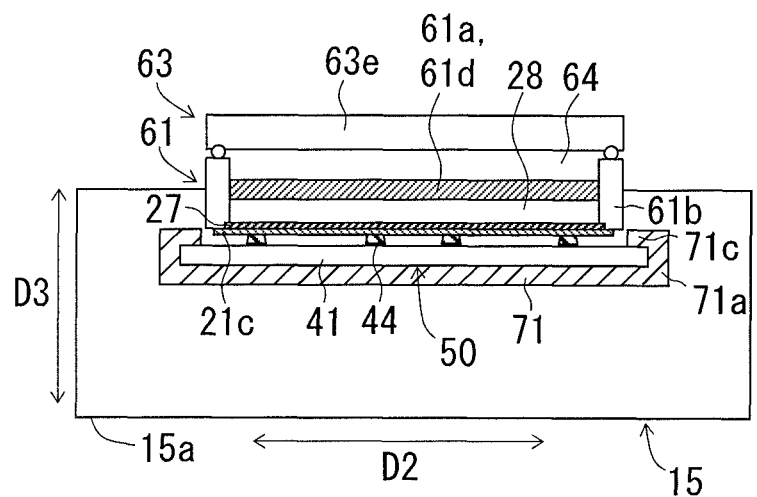
FIG. 20 is a diagram showing a further modification of the intermediate product processing device.

Furthermore, in the present modification, there is no need to press the second surface 21e of the lid member 21c strongly against the first side surfaces 61b (or the like) of the first sealing jig 61. This increases layout flexibility of the members around the intermediate product 50. Consider a case in which, for example, a hook-shaped portion 71c adapted to support the element forming surface 41a of the substrate 41, as shown in FIG. 20, is disposed at both ends of the substrate retaining jig 71. Such hook-shaped portions 71c are difficult to dispose in the case that the formation of the enclosed space 28 needs a member working with a first side surface 61b to hold the lid member 21c from both sides. In the present modification, on the other hand, the enclosed space 28 is already formed by fixing the film 27 to the first side surfaces 61b of the first sealing jig 61. The hook-shaped portions 71c can therefore be disposed by disposing the first side surfaces 61b of the first sealing jig 61 internally to the hook-shaped portions 71c so as not to cause interference with the hook-shaped portions 71c. Hence, the intermediate product 50 can be more stably retained using the substrate retaining jig 71.

Figure 21:
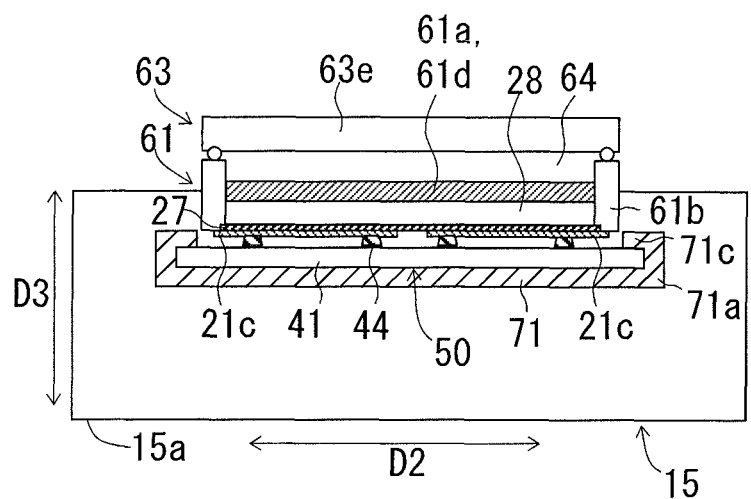
FIG. 21 is a diagram showing a further modification of the intermediate product processing device.

Moreover, in the present modification, the lid member 21c is brought into close contact with the intermediate product 50 by being held down by the film 27, not by being held down by the pressure from a gas. For this reason, even in an example where a plurality of lid members 21c need to be brought into close contact with one intermediate product 50 as shown in FIG. 21, close fitting of two lid members 21c can be provided by using one enclosed space 28. In other words, the number of lid members 21c can be increased without changing a basic configuration of the first sealing jig 61, third sealing jig 63, or film 27. To increase a geometry of the substrate 41, therefore, simply increasing the number of lid members 21c having the same size as that of conventional ones, for example, and besides, simply enlarging the first sealing jig 61, the third sealing jig 63, and/or the film 27 enable the increase in the geometry of the substrate 41 to be accommodated. In the example of FIG. 21, two lid members 21c are arranged adjacently to each other along a second direction D2 orthogonal to a first direction D1 in which the lid members 21c are to be transported, but this example does not limit the number of lid members 21c.

While several modifications have been described for the embodiment of the present invention, two or more of the modifications can obviously be applied in combination as well.

DESCRIPTION OF REFERENCE CHARACTERS

10: Element manufacturing apparatus
15: Intermediate product processing device
20: Sealing mechanism
21: Lid member supply part
21c: Lid member
23: Pressure application part
24: Substrate
25: Packing
26: Gas injecting section
27: Film
28: Enclosed space
30: Removal mechanism
31: Light irradiator
40: Organic semiconductor element
41: Substrate
42: First electrode
43: Auxiliary electrode
44: Protrusion
45: Organic semiconductor layer
46: Second electrode
50: Intermediate product
61: First sealing jig
62: Second sealing jig
63: Third sealing jig
64: Outer enclosed space
71: Substrate retaining jig
72: Auxiliary chamber

The invention claimed is:
1. An element manufacturing method for forming an element on a substrate, the method comprising:
a step of providing an intermediate product that includes the substrate and a protrusion extending in a normal direction of the substrate;
a step of covering the intermediate product, at a side where the protrusion is provided, with a first surface of a lid member; and
a close-fitting step of bringing the first surface of the lid member into close contact with the intermediate product in such a manner that a gas is injected into an enclosed space hermetically sealed from surroundings and formed on the lid member at a second surface opposite to the first surface so that an internal pressure of the enclosed space becomes higher than an internal pressure of a space between the lid member and the intermediate product, wherein:
the element includes the substrate, a plurality of first electrodes each disposed on the substrate, an auxiliary electrode and the protrusion, both disposed between the first electrodes, an organic semiconductor layer disposed on the first electrode, and a second electrode disposed on the organic semiconductor layer and the auxiliary electrode;
the intermediate product includes the substrate, the plurality of first electrodes disposed on the substrate, the auxiliary electrode and protrusion disposed between the first electrodes, and the organic semiconductor layer disposed on the first electrode and the auxiliary electrode; and
the element manufacturing method further comprises the step of, after the close-fitting step, removing the organic semiconductor layer disposed on the auxiliary electrode.

2. The element manufacturing method according to claim 1, further comprising the step of:
prior to the close-fitting step, forming the enclosed space hermetically sealed from surroundings, in a space contiguous to the second surface of the lid member.

3. The element manufacturing method according to claim 2, wherein:
the enclosed space is formed in a space bounded by the second surface of the lid member and a first sealing jig placed at a side of the second surface of the lid member; and
the enclosed space is formed by moving the lid member toward the first sealing jig so that the lid member and the first sealing jig come into contact with each other.

4. The element manufacturing method according to claim 1, wherein:
the enclosed space is formed in a space bounded by a film disposed so as to face the second surface of the lid member, and a first sealing jig to which the film is fixed;
the enclosed space is formed at an opposite side of the film relative to a side thereof that faces the lid member; and
in the close-fitting step, the first surface of the lid member is brought into close contact with the intermediate product in such a manner that a gas is injected into the enclosed space so that an internal pressure of the enclosed space becomes higher than an internal pressure of a space present between the lid member and the intermediate product, resulting expansion of the enclosed space displaces the film toward the lid member, and thus the film presses the lid member.

5. The element manufacturing method according to claim 3, further comprising a light irradiation step executed so that while the first surface of the lid member is in close contact with the intermediate product in the close-fitting step, a light irradiator disposed externally to the first sealing jig irradiates the intermediate product with light through the first sealing jig and the lid member, wherein:
the first sealing jig includes a light-transmitting region formed from a material having a light-transmitting property.

6. The element manufacturing method according to claim 5, wherein:
in the close-fitting step, an outer enclosed space blocked from atmospheric air is formed in an external space of the first sealing jig that is contiguous to the light-transmitting region thereof, and the light irradiator is disposed externally to the outer enclosed space; and
in the light irradiation step, the external space of the first sealing jig that is contiguous to the light-transmitting region of the first sealing jig communicates with a space surrounding the light irradiator.

7. The element manufacturing method according to claim 1, wherein the method is executed under a vacuum environment.

8. The element manufacturing method according to claim 1, wherein the lid member is supplied by a roll-to-roll process.

9. An element manufacturing method for forming an element on a substrate, the method comprising:
a step of providing an intermediate product that includes the substrate and a protrusion extending in a normal direction of the substrate;
a step of covering the intermediate product, at a side where the protrusion is provided, with a first surface of a lid member; and
a close-fitting step of bringing the first surface of the lid member into close contact with the intermediate product in such a manner that a gas is injected into an enclosed space hermetically sealed from surroundings and formed on the lid member at a second surface opposite to the first surface so that an internal pressure of the enclosed space becomes higher than an internal pressure of a space between the lid member and the intermediate product, wherein:
a vapor deposition material is disposed on the first surface of the lid member; and
the element manufacturing method further includes the step of, after the close-fitting step, vapor-depositing the vapor deposition material on the substrate by irradiating the vapor deposition material with light.

10. The element manufacturing method according to claim 9, further comprising the step of:
prior to the close-fitting step, forming the enclosed space hermetically sealed from surroundings, in a space contiguous to the second surface of the lid member.

11. The element manufacturing method according to claim 9, wherein:
the enclosed space is formed in a space bounded by the second surface of the lid member and a first sealing jig placed at a side of the second surface of the lid member; and
the enclosed space is formed by moving the lid member toward the first sealing jig so that the lid member and the first sealing jig come into contact with each other.

12. The element manufacturing method according to claim 11, further comprising a light irradiation step executed so that while the first surface of the lid member is in close contact with the intermediate product in the close-fitting step, a light irradiator disposed externally to the first sealing jig irradiates the intermediate product with light through the first sealing jig and the lid member, wherein:
the first sealing jig includes a light-transmitting region formed from a material having a light-transmitting property.

13. The element manufacturing method according to claim 12, wherein:
in the close-fitting step, an outer enclosed space blocked from atmospheric air is formed in an external space of the first sealing jig that is contiguous to the light-transmitting region thereof, and the light irradiator is disposed externally to the outer enclosed space; and
in the light irradiation step, the external space of the first sealing jig that is contiguous to the light-transmitting region of the first sealing jig communicates with a space surrounding the light irradiator.

14. The element manufacturing method according to claim 9, wherein:
the enclosed space is formed in a space bounded by a film disposed so as to face the second surface of the lid member, and a first sealing jig to which the film is fixed;
the enclosed space is formed at an opposite side of the film relative to a side thereof that faces the lid member; and
in the close-fitting step, the first surface of the lid member is brought into close contact with the intermediate product in such a manner that a gas is injected into the enclosed space so that an internal pressure of the enclosed space becomes higher than an internal pressure of a space present between the lid member and the intermediate product, resulting expansion of the enclosed space displaces the film toward the lid member, and thus the film presses the lid member.

15. The element manufacturing method according to claim 9, wherein the method is executed under a vacuum environment.

16. The element manufacturing method according to claim 9, wherein the lid member is supplied by a roll-to-roll process.

17. An element manufacturing apparatus for forming an element on a substrate, the apparatus comprising:
a sealing mechanism configured to bring a lid member into close contact with an intermediate product that includes the substrate and a protrusion extending in a normal direction of the substrate, the lid member being brought into close contact on the protrusion, wherein
the sealing mechanism includes a lid member supply part that supplies the lid member and a pressure application part, the pressure application part being configured to bring the first surface of the lid member into close contact with the intermediate product in such a manner that a gas is injected into an enclosed space hermetically sealed from surroundings and formed on a second surface of the lid member opposite to the first surface so that an internal pressure of the enclosed space becomes higher than an internal pressure of a space between the lid member and the intermediate product, wherein:
the element includes the substrate, a plurality of first electrodes each disposed on the substrate, an auxiliary electrode and the protrusion, both disposed between the first electrodes, an organic semiconductor layer disposed on the first electrode, and a second electrode disposed on the organic semiconductor layer and the auxiliary electrode;
the intermediate product includes the substrate, the plurality of first electrodes disposed on the substrate, the auxiliary electrode and protrusion disposed between the first electrodes, and the organic semiconductor layer disposed on the first electrode and the auxiliary electrode; and the element manufacturing apparatus further includes a removal mechanism that while the lid member is in close contact with the intermediate product, removes the organic semiconductor layer disposed on the auxiliary electrode.

18. The element manufacturing apparatus according to claim 17, wherein:

the enclosed space is formed in the space bounded by the second surface of the lid member and a first sealing jig placed at a side of the second surface of the lid member; and the enclosed space is formed by relatively moving the lid member with respect to the first sealing jig so that the lid member and the first sealing jig come into contact with each other.

19. The element manufacturing apparatus according to claim 18, further comprising a light irradiator disposed externally to the first sealing jig, wherein:

the light irradiator emits light toward the intermediate product through the first sealing jig and the lid member while the first surface of the lid member is in close contact with the intermediate product; and the first sealing jig includes a light-transmitting region formed from a material having a light-transmitting property.

20. The element manufacturing apparatus according to claim 19, wherein:

the sealing mechanism further includes a third sealing jig disposed adjacently to the light-transmitting region of the first sealing jig, the third sealing jig including an open-and-close controllable window;

when the pressure in the internal space of the first sealing jig is lower than the second pressure, an outer enclosed space blocked from atmospheric air and contiguous to the light-transmitting region of the first sealing jig is formed in an internal space of the third sealing jig and the light irradiator is disposed externally to the outer enclosed space; and when the light irradiator emits light toward the intermediate product, the open-and-close controllable window of the third sealing jig is opened.

21. The element manufacturing apparatus according to claim 17, wherein:

the enclosed space is formed in a space bounded by a film disposed so as to face the second surface of the lid member, and a first sealing jig to which the film is fixed;

the enclosed space is formed at an opposite side of the film relative to a side thereof that faces the lid member; and the pressure application part is configured to bring the first surface of the lid member into close contact with the intermediate product in such a manner that a gas is injected into the enclosed space so that an internal pressure of the enclosed space becomes higher than an internal pressure of a space present between the lid member and the intermediate product, resulting expansion of the enclosed space displaces the film toward the lid member, and thus the film presses the lid member.

22. The element manufacturing apparatus according to claim 17, wherein the apparatus forms an element on a substrate under a vacuum environment.

23. The element manufacturing apparatus according to claim 17, wherein the lid member supply part is configured to supply the lid member by a roll-to-roll process.

24. An element manufacturing apparatus for forming an element on a substrate, the apparatus comprising:

a sealing mechanism configured to bring a lid member into close contact with an intermediate product that includes the substrate and a protrusion extending in a normal direction of the substrate, the lid member being brought into close contact on the protrusion, wherein the sealing mechanism includes a lid member supply part that supplies the lid member and a pressure application part, the pressure application part being configured to bring the first surface of the lid member into close contact with the intermediate product in such a manner that a gas is injected into an enclosed space hermetically sealed from surroundings and formed on a second surface of the lid member opposite to the first surface so that an internal pressure of the enclosed space becomes higher than an internal pressure of a space between the lid member and the intermediate product, wherein:

a vapor deposition material is disposed on the first surface of the lid member; and the element manufacturing apparatus further includes a vapor deposition mechanism that vapor-deposits the vapor deposition material on the substrate by irradiating the vapor deposition material with light while the lid member is in close contact with the intermediate product.

25. The element manufacturing apparatus according to claim 24, wherein:

the enclosed space is formed in the space bounded by the second surface of the lid member and a first sealing jig placed at a side of the second surface of the lid member; and the enclosed space is formed by relatively moving the lid member with respect to the first sealing jig so that the lid member and the first sealing jig come into contact with each other.

26. The element manufacturing apparatus according to claim 24, wherein:

the enclosed space is formed in a space bounded by a film disposed so as to face the second surface of the lid member, and a first sealing jig to which the film is fixed;

the enclosed space is formed at an opposite side of the film relative to a side thereof that faces the lid member; and the pressure application part is configured to bring the first surface of the lid member into close contact with the intermediate product in such a manner that a gas is injected into the enclosed space so that an internal pressure of the enclosed space becomes higher than an internal pressure of a space present between the lid member and the intermediate product, resulting expansion of the enclosed space displaces the film toward the lid member, and thus the film presses the lid member.

27. The element manufacturing apparatus according to claim 25, further comprising a light irradiator disposed externally to the first sealing jig, wherein:

the light irradiator emits light toward the intermediate product through the first sealing jig and the lid member while the first surface of the lid member is in close contact with the intermediate product; and the first sealing jig includes a light-transmitting region formed from a material having a light-transmitting property.

28. The element manufacturing apparatus according to claim 27, wherein:
the sealing mechanism further includes a third sealing jig disposed adjacently to the light-transmitting region of the first sealing jig, the third sealing jig including an open-and-close controllable window;
when the pressure in the internal space of the first sealing jig is lower than the second pressure, an outer enclosed space blocked from atmospheric air and contiguous to the light-transmitting region of the first sealing jig is formed in an internal space of the third sealing jig and the light irradiator is disposed externally to the outer enclosed space; and
when the light irradiator emits light toward the intermediate product, the open-and-close controllable window of the third sealing jig is opened.

29. The element manufacturing apparatus according to claim 24, wherein the apparatus forms an element on a substrate under a vacuum environment.

30. The element manufacturing apparatus according to claim 24, wherein the lid member supply part is configured to supply the lid member by a roll-to-roll process.

* * * * *